(12) United States Patent
Keraly et al.

(10) Patent No.: US 11,642,796 B2
(45) Date of Patent: May 9, 2023

(54) TACTILE PERCEPTION APPARATUS FOR ROBOTIC SYSTEMS

(71) Applicant: Robotik Innovations, Inc., Palo Alto, CA (US)

(72) Inventors: Christopher Lalau Keraly, San Francisco, CA (US); Clinton J. Smith, San Francisco, CA (US); Christopher A. Paulson, Redwood City, CA (US); Bernard D. Casse, Saratoga, CA (US); Matthew E. Shaffer, Menlo Park, CA (US)

(73) Assignee: RIOS Intelligent Machines, Inc., Menlo Park, CA (US)

( * ) Notice: Subject to any disclaimer, the term of this patent is extended or adjusted under 35 U.S.C. 154(b) by 561 days.

(21) Appl. No.: 16/832,690

(22) Filed: Mar. 27, 2020

(65) Prior Publication Data

US 2020/0306986 A1    Oct. 1, 2020

Related U.S. Application Data

(60) Provisional application No. 62/826,834, filed on Mar. 29, 2019, provisional application No. 62/826,816, (Continued)

(51) Int. Cl.
*B25J 13/08*     (2006.01)
*B25J 15/08*     (2006.01)
(Continued)

(52) U.S. Cl.
CPC ............. *B25J 15/08* (2013.01); *B25J 9/1612* (2013.01); *B25J 9/1694* (2013.01); *B25J 13/082* (2013.01);
(Continued)

(58) Field of Classification Search
CPC ........ B25J 15/08; B25J 9/1602; B25J 9/1694; B25J 13/081; B25J 13/082; B25J 13/085; B25J 13/087
See application file for complete search history.

(56) References Cited

U.S. PATENT DOCUMENTS 5,739,476 A    4/1998   Namgung
6,343,263 B1   1/2002   Nichols et al.
(Continued)

FOREIGN PATENT DOCUMENTS

DE        4208610 C1    5/1993
GB        2115935 A     9/1983
(Continued)

*Primary Examiner* — Randell J Krug
(74) *Attorney, Agent, or Firm* — Bever, Hoffman Harms, LLP

(57) ABSTRACT

A human-like tactile perception apparatus for providing enhanced tactile information (feedback data) from an end-effector/gripper to the control circuit of an arm-type robotic system. The apparatus's base structure is attached to the gripper's finger and includes a flat/planar support plate that presses a pressure sensor array against a target object during operable interactions. The pressure sensor array generates pressure sensor data that indicates portions of the array contacted by surface features of the target object. A sensor data processing circuit generates tactile information in response to the pressure sensor data, and then transmits the tactile information to the robotic system's control circuit. An optional mezzanine connector extends through an opening in the support plate to pass pressure sensor data to the processing circuit. An encapsulating layer covers the pressure sensor array and transmits pressure waves generated by slipping objects to enhance the tactile information.

18 Claims, 8 Drawing Sheets

Related U.S. Application Data filed on Mar. 29, 2019, provisional application No. 62/826,312, filed on Mar. 29, 2019.

(51) Int. Cl.
  *B25J 9/16* (2006.01)
  *G06F 13/42* (2006.01)

(52) U.S. Cl.
  CPC ........... *B25J 13/083* (2013.01); *B25J 13/085* (2013.01); *B25J 13/087* (2013.01); *G06F 13/4282* (2013.01); *G06F 2213/0042* (2013.01)

(56) References Cited

U.S. PATENT DOCUMENTS

| | | | |
|---|---|---|---|
| 7,878,075 | B2 | 2/2011 | Johansson et al. |
| 2004/0246681 | A1 | 12/2004 | Belady et al. |
| 2005/0079375 | A1 | 4/2005 | Dean et al. |
| 2008/0296057 | A1 | 12/2008 | Dudnikov, Jr. |
| 2011/0266923 | A1 | 11/2011 | Chuang et al. |
| 2012/0202386 | A1 | 8/2012 | McNamara et al. |
| 2013/0238129 | A1* | 9/2013 | Rose .................... B25J 19/0029 700/258 |

FOREIGN PATENT DOCUMENTS

| | | |
|---|---|---|
| WO | 198801747 | 3/1988 |
| WO | 2018129626 A1 | 7/2018 |

* cited by examiner

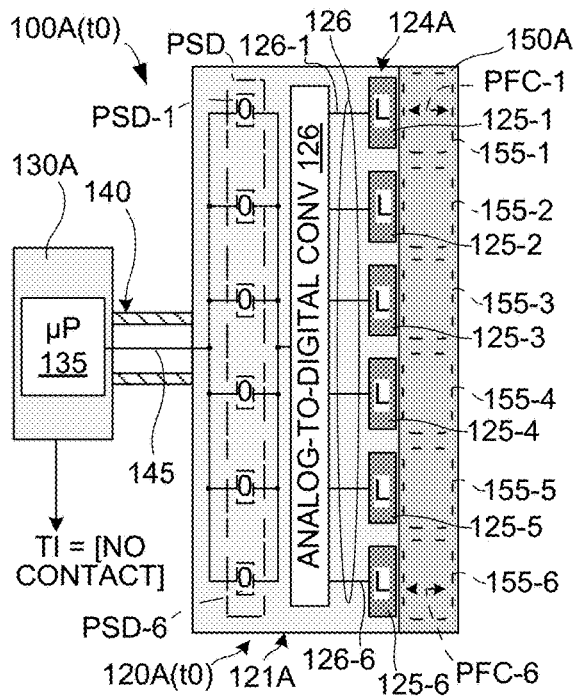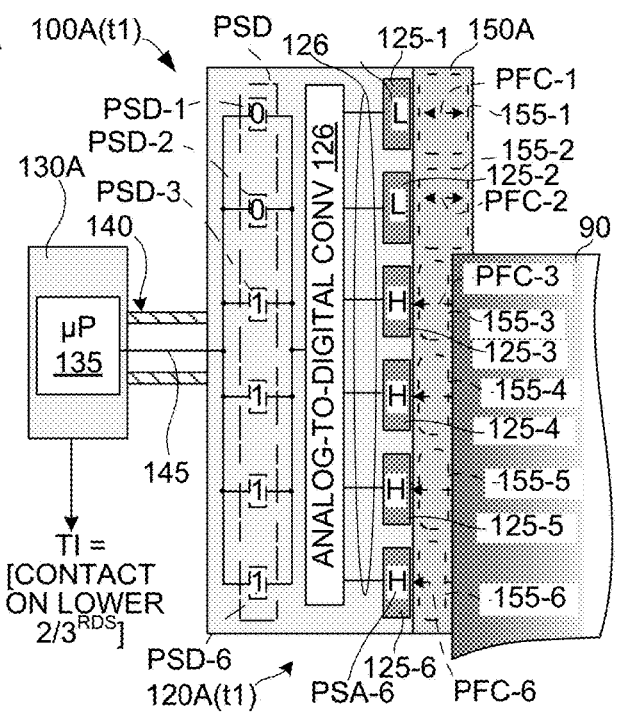
FIG. 3A
FIG. 3B
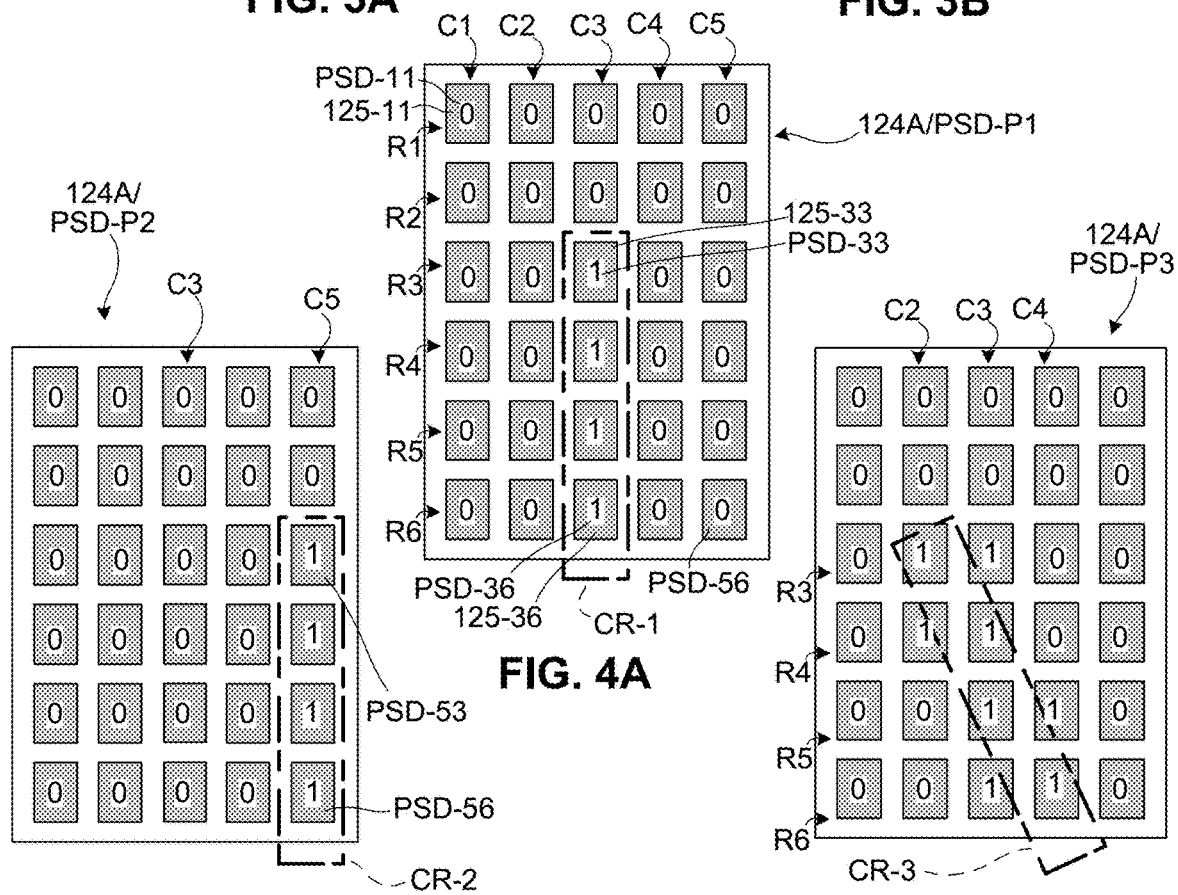
FIG. 4A
FIG. 4B
FIG. 4C

TACTILE PERCEPTION APPARATUS FOR ROBOTIC SYSTEMS

RELATED APPLICATION

This application claims priority from U.S. Provisional Patent Application No. 62/826,312, entitled "Humanlike Tactile Perception System for Smart Robotic Fingers", filed on Mar. 29, 2019, from U.S. Provisional Patent Application No. 62/826,816, entitled "Multimodal, 3D Sensing Architecture For Robotic Tactile Exploration", filed on Mar. 29, 2019, and from U.S. Provisional Patent Application No. 62/826,834, entitled "Out of Plane Circuitry for Piezoelectric Tactile Sensors", filed on Mar. 29, 2019.

FIELD OF THE INVENTION

This invention relates generally to robotic systems and more particularly to end-effector sensors for arm-type robot mechanisms.

BACKGROUND OF THE INVENTION

Most modern robotic systems integrate mechanical, electrical/electronic and computer science technologies to provide autonomously controlled mechanisms capable of performing a variety of programmed operations (tasks). For example, articulated robots are a class of industrial robotic systems in which a control circuit converts user-provided software-based instructions into motor control signals that control a robot arm mechanism and attached end effector (e.g., a hand or gripper) to perform repetitive tasks, such as moving target objects from one location to another location. To perform such programmed operations, the software-based instructions provided to most articulated robots must specify three-dimensional (3D) coordinates of the starting location at which the target objects are located for pick-up, a designated 3D travel path through which the target objects may be moved without interference, and 3D coordinates defining the terminal location (e.g., a receptacle or support surface) at which the target objects are to be placed. When suitable software-based instructions are provided, the control circuit generates a corresponding series of motor control signals that cause the robot arm mechanism to move the end effector to the initial/starting location coordinates, then cause the end effector to close on (grasp) the target object, then cause the robot arm mechanism to lift/move the target object to the terminal location coordinates along the designated travel path, and then cause the end effector to open/release the target object.

Most conventional robotic systems utilize no sensing architecture, and those that do utilize single-modality sensing architectures. Conventional robotic systems that utilize no sensing architecture rely entirely on pre-programmed commands, and typically fail to adjust for minor positional variations to unanticipated environmental variations. In contrast, single-modality sensing architectures provide feedback information to a host robotic system's control circuit, thereby allowing the control circuit to modify user-provided program instructions in order to accommodate minor positional variations (i.e., relative to program-based coordinates). That is, although the above-described programmed operation approach may be solely used in highly ordered environments, most practical operating environments include random positional variances and other unanticipated events that can cause erroneous operations and possibly dangerous situations. For example, the inadvertent displacement of a target object away from its designated starting location coordinates may prevent successfully grasping by the end effector, and in some cases may result in damage to the target object and/or end effector/gripper (e.g., due to off-center contact between the end effector and the target object during the grasping operation). To avoid such incidents, modern robotic systems often employ single-modal sensing architectures (e.g., one or more force sensors disposed on the end effector) and/or camera systems that are configured to provide feedback information that allows the system's control circuit to recognize and adjust the programmed operation to accommodate minor variations. For example, a single-modal sensor disposed on an end effector may provide feedback information indicating the displacement of a target object away from the designated starting location coordinates (e.g., by way of unexpected contact with the target object during a grasping operation)—this feedback information may be utilized by the control circuit to adjust the robot arm mechanism such that the end effector is repositioned in a way that allows successful grasping of the displaced target object.

The lack of a rich end effector sensory feedback is one of the main limitations of modern robotic systems. That is, although single-modality sensing architectures may be used to prevent some industrial accidents, conventional single-modality sensors are currently unable to provide enough feedback information to allow a robotic system to perform complex assembly processes. For example, although single-modality pressure sensors may provide sufficient data to verify that a predetermined gripping force is being applied by an end effector onto a target object, such pressure sensors lack the rich sensor feedback needed to recognize when the target object is slipping from the end effector's grasp, and therefore are unable to avoid the resulting accident damage to the target object. In addition, when performing assembly tasks such as mounting a canister-type object over a cylindrical object, single-modality pressure sensors provide insufficient data regarding excessive contact between the cannister and cylindrical objects when the canister and cylindrical objects are misaligned. Note that while camera-type feedback systems may be useful to identify and adjust for such occurrences in some cases, critical portions of the camera's field of view are often occluded by the end effector, which limits the functionality of camera-type feedback systems. The image processing and inference times associated with camera-based techniques can also be too long to enable reflex-like adjustments to avoid inflicting damage. In contrast to single-modality sensors, the human hand consists of an unparalleled multimodal sensory system (i.e., mechanoreceptors sensing both pressure and vibration, and thermoreceptors sensing temperature), which largely contributes to its unprecedented dexterous manipulation. Specifically, the human multimodal sensing architecture provides fine-grained cues about contact forces, textures, local shape around contact points, and deformability, all of which are critical for evaluating an ongoing grasping operation, and to trigger force correction measures in case of instability.

What is needed is a sensing architecture for robotic systems that overcomes the deficiencies of conventional single-modality sensors. In particular, what is needed is a sensing architecture that provides robotic end effectors with tactile perception capabilities that facilitate enhanced human-like target object recognition and associated object manipulation control that cannot be achieved using conventional approaches.

SUMMARY OF THE INVENTION

The present invention is directed to a tactile perception apparatus that provides a robotic system's control circuit with tactile information derived from a two-dimensional (2D) array of pressure sensors disposed on the robotic system's contact structure(s) (e.g., an end-effector/gripper finger of an arm-type robot mechanism). The pressure sensor array is positioned such that at least some of the pressure sensors are pinched between a rigid base structure and a target object during operable interactions (normal robotic system operations, such as when the target object is grasped by the end-effector/gripper), and the pressure sensor array is configured such that each spaced-apart pressure sensor generates an associated sensor data amount corresponding to an amount of contact force applied onto a corresponding surface region (2D location) of the rigid base structure. With this arrangement, the collective pressure sensor data generated by all of the pressure sensors forming the pressure sensor array effectively provides a 2D pattern (e.g., similar to a contour map) indicating all pressure points generated by corresponding surface features of the target object, including the surface features' positions and orientations relative to the pressure sensor array. That is, when the target object is grasped, a contact region portion of the pressure sensor array is sandwiched (pinched) between the target object and the support plate, whereby pressure sensors located between raised "pressure point" surface features of the target object receive higher pressure force components, and therefore generate higher pressure data values, and pressure sensors located between recessed target object surface features receive lower or zero pressure force components, and therefore generate lower pressure data values, whereby the combined pattern of high and low pressure data values effectively form a 2D contour-map-type sensor data pattern describing various tactile characteristics associated with the target object. By providing such contour-map-type sensor data, the present invention facilitates the derivation of corresponding tactile information that provides a host robotic system with nearly human-fingertip-type tactile perception capabilities that far exceed data derived from conventional single-modality sensing architectures. For example, tactile information derived from pressure data indicating that a specific problematic contact situation (e.g., a target object is grasped in a problematic off-center position relative to the end-effector/gripper finger) may be utilized by the robotic system's control circuit to implement a corresponding corrective action (e.g., re-adjusting the end-effector/gripper such that the target object is in a centered position), thereby avoiding an associated operating error (e.g., dropping the target object during transport). Accordingly, the present invention provides robotic end effectors with tactile perception capabilities that facilitate enhanced human-like target object recognition and associated object manipulation control that cannot be achieved using conventional approaches.

According to a generalized embodiment the tactile perception apparatus includes a rigid base structure, a sensor board and a sensor data processing circuit. The rigid base structure is fixedly connected to the robotic system's contact structure (e.g., the rigid base structure is either integrally connected to or fastened onto a robotic gripper finger). The rigid base structure includes a cantilevered (or otherwise connected) support plate that is oriented such that an upper surface of the support plate faces toward the target object and an opposing (reverse-side) lower surface of the support plate faces away from the target object during normal robot system operations (e.g., during the performance of operable interactions such as grasping and lifting target objects). In some embodiments the sensor board includes a planar base substrate (e.g., a PCB structure or semiconductor wafer) on which the pressure sensor array is disposed (i.e., multiple pressure sensors are fabricated on the PCB structure in a 2D pattern), and the base substrate is mounted on the support plate such that the pressure sensors are respectively uniformly supported by associated upper surface regions of the support plate). With this arrangement each pressure sensor is pressed against its associated upper surface region by an associated pressure force component amount corresponding to the target object surface feature disposed over the associated upper surface region (e.g., the associated pressure force component amount has a high value when a corresponding convex raised target object surface feature applies a relatively high pressure force toward the associated upper surface region, and the associated pressure force component amount has a low value when a concave target object surface feature is positioned over the associated upper surface region). The sensor data processing circuit is also attached to the support plate and configured to (i) receive the pressure data values generated by the pressure sensors (i.e., by way of operably connection to the pressure sensor array), to (ii) generate tactile information in response to the pressure data values, and to (iii) transmit the tactile information to the host robotic system's control circuit (e.g., by way of data bus signal wire(s) that extend along intervening portions of the arm-type robotic mechanism). Mounting the sensor data processing circuit on the same support structure used to deploy the sensor array facilitates commercially feasible implementation of the tactile perception apparatus on existing robotic systems by facilitating the transmission of tactile information using a Universal Serial Bus (USB) or another industry standard or custom serial transmission scheme that is supported by a host robotic system's control circuit. Accordingly, the present invention provides robotic end effectors (and other contact structures) with tactile perception capabilities that facilitate enhanced human-like target object recognition and associated object manipulation control that cannot be achieved using conventional sensing architectures.

According to a presently preferred embodiment, the sensor data processing circuit is mounted onto a lower surface of the support plate (i.e., the support plate surface facing away from the target object during a given operable interaction), and is operably coupled to the sensor array by way of a mezzanine connector that passes through one or more corresponding through-plate openings. This specific configuration protects the sensor data processing circuit from potential damage caused by the contact forces generated during the operable interactions because the forces transmitted onto the pressure sensor array are effectively absorbed by the support plate (i.e., the contact forces are transmitted along the support plate to the corresponding base structure to which the support plate is rigidly connected, thereby shielding the sensor data processing circuit). This configuration also minimizes the transfer of thermal energy (e.g., heat generated by operation of the sensor data processing circuit) to the sensor board by way of utilizing the intervening support plate as a heat sink, thereby enabling, for example, accurate object temperature sensing operations.

According to another feature of the presently preferred embodiment, the support plate is configured such that its upper surface is planar (i.e., the upper surface lies in a flat 2D plane), and the pressure sensor array is disposed on a sensor board including a printed circuit board (PCB) structure that is also planar and is substantially entirely supported by planar upper surface of the support plate (i.e., all surface portions of the PCB structure contact upper support surface except regions disposed over the through-plate opening(s)). The planar configuration of the support plate and respective PCB structures facilitates low-cost manufacturing and assembly processes. In addition, mounting the sensor board on a flat upper support surface further facilitates consistent pressure data by providing uniform support for all pressure sensors in the sensor array. Although a planar/flat configuration is presently preferred for the pressure sensor and support plate, other surface configurations (e.g., planar/textured, curved or convex) may also be utilized, but these alternatives may increase manufacturing costs.

According to another feature of the presently preferred embodiment, the sensor board also includes an analog-to-digital converter (ADC) circuit that is mounted on the sensor board (first) PCB structure and configured to convert analog pressure sensor values generated by the pressure sensor array into a corresponding digital pressure sensor value that are then serially transmitted to the sensor data processing circuit by way of the mezzanine connector. In this embodiment, each pressure sensor is operably configured to generate a corresponding analog pressure sensor data value having a magnitude (amount) determined by its received contact force component (e.g., each pressure sensor generates a relatively low voltage pressure sensor data value in the absence of an applied contact force, and generates a relatively high voltage pressure sensor data value in response to a relatively high applied contact force component). Each analog pressure sensor data value is then converted by the ADC circuit into a corresponding digital pressure sensor data value that is then serially transmitted via a serial signal line of the mezzanine connector to the sensor data processing circuit. By utilizing serial data transmission to pass sensor data from the ADC circuit to the processing circuit, this approach accommodates the efficient production of tactile perception apparatus having a wide range of pressure sensor configurations (e.g., high resolution sensor arrays including a relatively large number of densely packed pressure sensors, or low resolution arrays including a relatively small number of pressure sensors) by facilitating the use of a small number of (e.g., one or two) mezzanine connectors that is/are capable of supporting any number of pressure sensors.

In some embodiments the apparatus is formed with a skin-like encapsulation layer that is disposed on an uppermost surface of the sensor board PCB structure. In some embodiments the encapsulation layer consists essentially of a durable flexible material (e.g., silicone rubber) that provides suitable friction for grasping and holding target objects, and serves to protect the pressure sensor array by way of acting as a thermal insulator and a shock absorber (i.e., by elastically deforming in response to contact forces applied by target objects during operation interactions). In a presently preferred embodiment, the encapsulating layer is implemented using a layer of silicone rubber having a thickness in the range of 0.5 mm to 10 mm and a material formulation characterized by having surface roughness from 0 to 300 microns RMS and a durometer of 30 A to 70 A. This specific silicone layer formulation and configuration facilitates the detection of objects slipping from the grasp of the robotic gripper by utilizing the encapsulating layer as a medium (i.e., a speaker-like mechanism) that transmits a high/low pressure wave front, which is generated in response to slipping-type displacement of a target object grasped by a robotic gripper, to the pressure sensor array (or to other vibration detecting sensors disposed on the sensor board). That is, the gripping force applied by a robotic gripper on a grasped object is typically set at a level that produces sufficient frictional force between the encapsulating layer's upper surface and the object's surface to reliably control (hold) the object during a designated operable interaction (e.g., moving the object from one location to another). However, in some cases moisture or other unexpected surface contaminants may cause a significant reduction in the frictional force between a grasped target object and the encapsulating layer, whereby the target object begins to slip (displace relative to the encapsulating layer), which can result in damage to the object unless corrective action is taken. By forming the encapsulating layer using silicone having the specifications mentioned above, slipping displacement in a lateral direction relative to the encapsulating layer (i.e., parallel to pressure sensor array) causes the silicone layer's surface generate a high/low alternating pressure wave front that can be easily detected as vibration force components by the pressure sensors (or by other vibration sensors mounted on the sensor board). Accordingly, by configuring the apparatus to generate tactile information indicating the start of a slipping process in response to detection of the vibration force components by the pressure sensors, the apparatus facilitates immediate corrective action by the host robotic system's control circuit (e.g., increasing the applied gripping force) to preventing further slipping and avoid damage to the target object.

In alternative specific embodiments the sensor board of the tactile perception apparatus utilizes various configurations and arrangements of pressure sensors, and optionally includes one or more additional sensor types that enhance the tactile information provided to a host robotic system's control circuit. In a presently preferred embodiment, the sensor board PCB structure includes at least two PCB stack-ups and the pressure sensors are piezoelectric-type sensors including piezoelectric ceramic material (e.g., lead zirconate titanate (PZT)) structures sandwiched between electrodes (contact pads) formed on opposing surfaces of the two PCB stack-ups. This sandwich-type arrangement maximizes signal collection by the from an applied force due to alignment of the opposing upper/lower contact pads with the d33 (longitudinal) piezoelectric coefficient of the PZT structures, which may be further enhanced by implementing a Faraday cage that shields the PZT structures from electronic noise. In other embodiments the pressure sensors are implemented using one or more other piezoelectric materials or sensor types, such as strain gauges, capacitive pressure sensors, cavity-based pressure sensors, piezoresistive sensors or piezoelectric sensors, where the pressure sensors are arranged in a symmetric, asymmetric or random pattern. In some embodiments, one or more additional sensor types (e.g., vibration sensors and/or temperature sensors) are also provided on the sensor board PCB structure and operably coupled to the sensor data processing circuit, where the additional sensor(s) are either fabricated/mounted on the same PCB stack-up as the pressure sensors or on a different PCB stack-up of a multi-layer sensor board PCB structure.

Various additional features are implemented in a disclosed practical embodiment that further enhance the beneficial aspects of the invention. For example, the sensor board is enhanced to include two or more ADC circuits to more efficiently accommodate different sensor types, and an optional controller may be included to facilitate different sensing modes (e.g., static versus vibration measurements). The tactile information generation process performed by the sensor data processing circuit may be enhanced by way of utilizing a programmable logic device (e.g., a field-programmable gate array (FPGA) or a programmable-system-on-chip (PSOC) circuit), and efficient transmission of the tactile information may be accomplished using a Universal Serial Bus (USB) circuit. In one embodiment the base structure is an integral metal structure (e.g., aluminum or steel) having planar/flat upper and lower support plate surfaces, an integral mounting flange configured to facilitate rigid connection of the base structure to a robotic gripper finger, and peripheral walls that surround the support plate to form upper and lower pocket regions. With this configuration, when the sensor board and sensor data processing circuit are respectively inserted into the upper and lower pocket regions such that they are flush against the upper and lower support plate surfaces, respectively, the base structure forms an efficient heat sink structure that maintains the apparatus at an optimal operating temperature. In one embodiment the sensor board and sensor data processing circuit are secured into place by way of a potting material.

According to a practical embodiment of the present invention, a robotic system implements two or more tactile perception apparatus on associated contact structures of opposing end effector (gripper) fingers. In this case, the respective processing circuits of each apparatus is operably coupled to the robotic system's control circuit by way of associated serial (e.g., USB) data buses that extend along the robot (arm) mechanism between the end effector and the control circuit. In one embodiment, the tactile information generated by one or both tactile perception apparatus is provided to a local gripper control circuit (actuator) mounted on the gripper to facilitate minimum-delay operations (e.g., increasing applied grasping force when object slipping is detected).

According to another embodiment of the present invention, a method for controlling a robotic system involves utilizing one or more tactile perception apparatus described above to generate tactile information in response to contact forces applied by a target object to corresponding contact structures of an end effector while grasping (or otherwise operably interacting with) the target object. The tactile information generated by the tactile perception apparatus is provided to the robotic system's control circuit, and optionally provided to a local gripper control circuit (actuator) mounted on the gripper to facilitate minimum-delay operations (e.g., increasing applied grasping force when object slipping is detected).

BRIEF DESCRIPTION OF THE DRAWINGS

These and other features, aspects and advantages of the present invention will become better understood with regard to the following description, appended claims, and accompanying drawings, where:

FIGS. 3A and 3B are cross-sectional side views depicting a simplified tactile perception apparatus according to a first specific embodiment of the present invention;

FIGS. 4A, 4B and 4C are diagrams depicting the generation of exemplary tactile information indicating the static position of a target object using pressure sensor data generated by the tactile perception apparatus of FIGS. 3A and 3B;

DETAILED DESCRIPTION OF THE DRAWINGS

The present invention relates to a tactile perception apparatus (i.e., a target object sensing architecture) that greatly enhances the capabilities of robotic systems. The following description is presented to enable one of ordinary skill in the art to make and use the invention as provided in the context of a particular application and its requirements. As used herein, directional terms such as "upper", "lower", "lowered", "front" and "back", are intended to provide relative positions for purposes of description and are not intended to designate an absolute frame of reference. With reference to electrical connections between circuit elements, the terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described but is to be accorded the widest scope consistent with the principles and novel features herein disclosed.

Figure 1:
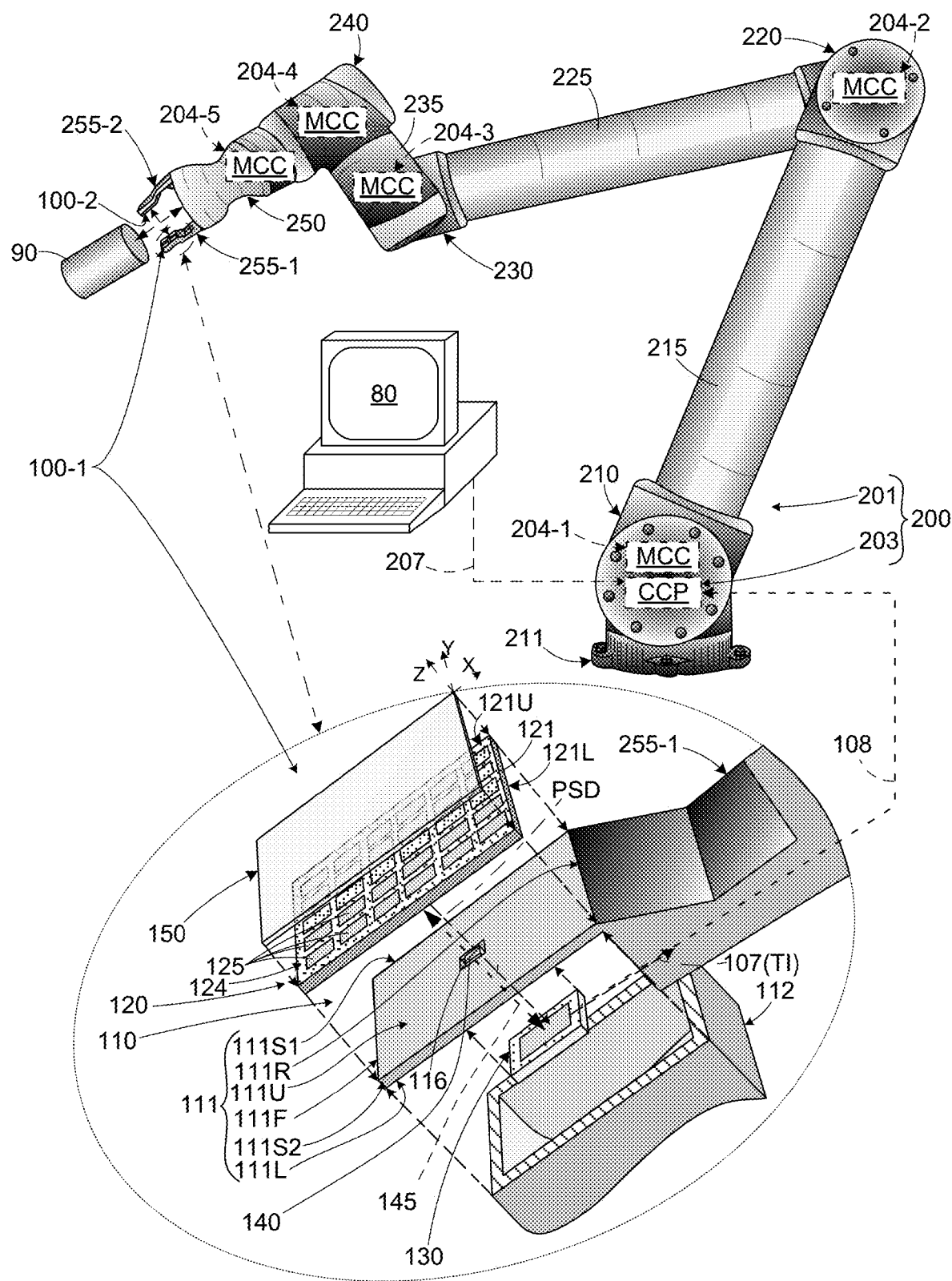
FIG. 1 is a diagram depicting a tactile perception apparatus implemented on an end-effector of an arm-type robotic system according to an embodiment of the present invention.

FIG. 1 shows an exemplary robotic system 200 that is provided to illustrate an exemplary use of tactile perception apparatus of the present invention. Robot system 200 is an arm-type robotic system generally including a robot arm-type mechanism 201 and a control circuit (CC) 203 (e.g., a microprocessor).

Robot mechanism 201 includes various mechanisms and structures that are operably configured in accordance with known techniques and controlled to manipulate a target object 90 by way of various actuators. In the exemplary embodiment robot mechanism 201 includes a shoulder/base mechanism 210 configured for fixed attachment to a work surface (not shown) by way of a fixed base 211, an upper arm structure 215 extending from the shoulder/base mechanism 210 to an elbow mechanism 220, a forearm structure 225 extending from the elbow mechanism 220 to a wrist mechanism 230, a wrist structure 235 extending from the wrist mechanism 230 to hand/axial rotation mechanism 240, and an end effector 250 operably connected to a terminal portion of the hand/axial rotation mechanism 240. End effector 250 is a hand/gripper-type mechanism disposed at a distal end of robot arm mechanism 201 having two gripper fingers 255-1 and 255-2 that open (move away from each other) or close (move toward each other) in accordance with the corresponding actuation of motors mounted inside the gripper structure. Robot mechanism 201 also includes multiple actuators, each actuator including a motor control circuit (MCC) configured to turn on/off one or more associated electric motors (not shown) in response to control signals received from control circuit 203. For example, motor control circuit (MCC) 204-1 and associated first motor(s) form a first actuator disposed in shoulder-base mechanism 210 to facilitate selective rotation and pivoting of upper arm structure 215 relative to fixed base 211, a second actuator including MMC 204-2 is disposed in elbow mechanism 220 to facilitate selective pivoting of forearm structure 225 relative to upper arm structure 215, a third actuator including MMC 204-3 is disposed in wrist mechanism 230 to facilitate selective pivoting of wrist structure 235 relative to forearm structure 225, a fourth actuator including MMC 204-4 is disposed in hand axial rotation mechanism 240 to facilitate selective pivoting of gripper 250 relative to wrist structure 235, and a fifth actuator including MMC 204-5 disposed in end effector 250 that controls opening/closing of gripper fingers 255-1 and 255-2 relative to gripper 250. As mentioned above, robot mechanism 201 is merely introduced to provide a simplified context for explaining the features and benefits of the present invention, and the specific configuration of robot mechanism 201 is not intended to limit the appended claims. For example, although end-effector 250 is depicted as a two-fingered gripper, end-effector 250 may also be implemented using a probe or a gripper having any number of fingers with one or more joints/degrees of freedom per finger.

Control circuit 203 causes robot mechanism 201 to perform a user-designated operation by way of transmitting control signals to selected actuators in an associated control signal sequence. Each control signal sequence includes one or more primary control signals, which are generated by the control circuit's operating system software in accordance with user-provided instructions 207, and zero or more secondary control signals, which are generated by feedback data 107 received from various sensors or feedback mechanisms and includes tactile information TI received from one or more tactile perception apparatus of the present invention. The user-provided instructions 207 are transmitted to control circuit 203 from a programming device 80 (e.g., a personal computer or workstation) and specify associated tasks to be performed by robot mechanism 201. As described in the background section (above) control circuit 203 generates primary control signals in accordance with user-provided instructions 207 that specify a desired task and transmits the primary robot control signals via wires (not shown) to MMCs 204-1 to 204-5 of the various actuators disposed on robot mechanism 201, thereby robot mechanism 201 to perform the specified tasks involving operable interactions with target objects. For example, to perform an operable interaction involving controlling gripper 250 to grasp target object 90, the control signal generator of control circuit 203 processes corresponding user-provided instructions 207 and generates/transmits first control signals to MCC 204-5 that cause the actuator disposed in end-effector 250 to increase a gap between gripper fingers 255-1 and 255-2 in accordance with an "open gripper" control instruction, then generates/transmits second control signals to MCCs 204-1 to 204-4 that cause upper the actuators disposed in arm structure 215, forearm structure 225, wrist structure 235 and axial rotation mechanism 240 to position end-effector 250 at designated X-Y-Z location coordinates such that gripper fingers 255-1 and 255-2 are disposed on opposite sides of target object 90, and then generates/transmits third control signals to MCC 204-5 that causes end-effector 250 to decrease the gap between gripper fingers 255-1 and 255-2 and to apply a grasping force onto target object 90 (i.e., such that gripper fingers 255-1 and 255-2 apply opposing contact forces against opposite sides of target object 90 in response to the "close gripper" control instruction). During each operable interaction, control circuit 203 utilizes feedback data 107 to modify (e.g., adjust or terminate) operations defined by user-provided instructions 207 in response to undesirable conditions that may arise during execution of the associated primary robot control signals. For example, when feedback data 107 indicates target object 90 is offset from the expected X-Y-Z location, control circuit 203 may modify the operation to adjust the position of gripper 250 to facilitate grasping target 90 at the offset X-Y-Z location.

Referring to FIGS. 1 and 2, tactile perception apparatus 100-1 and 100-2 are respectively fixedly attached to opposing contact surfaces of gripper fingers 255-1 and 255-2 such that apparatus 100-1 and 100-2 face target object 90 during operable interactions with object 90. Each apparatus 100-1 and 100-2 is configured to provide tactile information TI that forms at least a part of feedback data (information) 107 provided to control circuit 203 during operable interactions, with apparatus 100-2 including all features and details of apparatus 100-1 described below). In alternative embodiments only one tactile perception apparatus may be used (i.e., either apparatus 100-1 or apparatus 100-2), or more than two apparatus may be used (e.g., in the case of a gripper including three or more fingers).

Referring to the dash-line bubble indicated at the lower portion of FIG. 1, in an exemplary embodiment tactile perception apparatus 100-1 includes a rigid base structure 110, a pressure board 120 including a pressure sensor array 124 disposed on a PCB structure 121, and a sensor data processing circuit 130. In some embodiments apparatus 100-1 also includes a mezzanine connector 140 that passes signals between pressure board 120 and sensor data processing circuit 130, and a skin-like encapsulating layer 150 consisting essentially of a durable flexible material (e.g., silicone rubber) that is disposed on an uppermost surface 121U of the sensor board PCB structure 121. Although present invention is described below with specific reference to apparatus 100-1, apparatus 100-2 includes the structures and configuration described below with reference to perception apparatus 100-1.

Figure 2A:
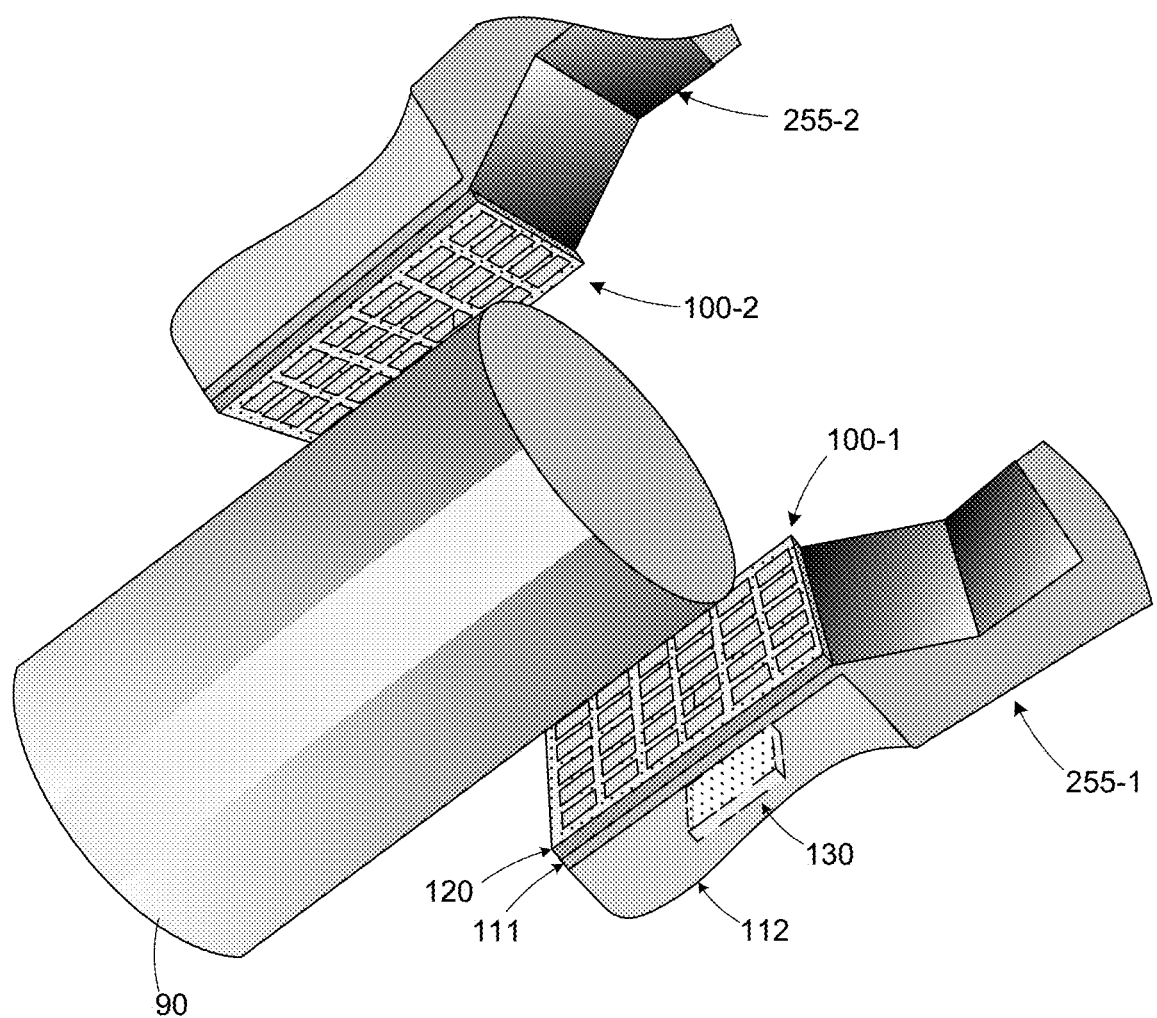
FIGS. 2A and 2B are perspective and cross-sectional side views showing gripper finger structures of the robotic system of FIG. 1.
Figure 2B:
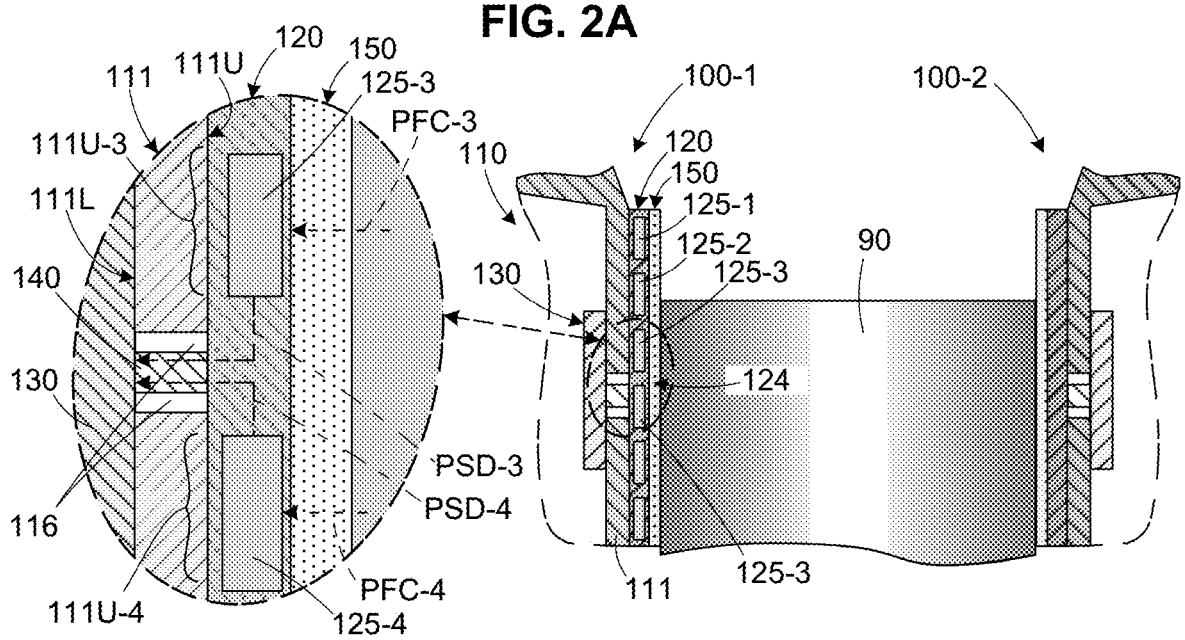

Referring to the bubble in FIG. 1, base structure 110 includes a support plate 111 configured for fixed connection to finger 255-1 of gripper (end effector) 250. Support plate 111 has an upper surface 111U, an opposing lower surface 111L, opposing side edges 111S1 and 111S2, and opposing front and rear edges 111F and 111R. In the embodiment shown in FIG. 1 the fixed connection of base structure 110 to finger 255-1 is achieved by way of an integral connection along rear edge 111R of support plate 111 to an end of finger 255-1, whereby support plate 111 forms a cantilevered structure disposed at a distal end of arm mechanism 201. In other embodiments (e.g., described below with reference to FIGS. 11A and 12), base structure 110 may be configured for fixed connection to finger 255-1 (e.g., by way of bolts or other fasteners), and may be attached in another (e.g., simply supported) configuration. In any case, base structure 110 is configured such that, as indicated in FIGS. 2A and 2B, upper surface 111U of support plate 111 faces target object 90 and lower surface 111L faces away from target object 90 during operable interactions. In some embodiments base structure 110 comprises metal (e.g., aluminum or steel), one or both of upper surface 111U and lower surface 111L are planar (flat), and support plate 111 is machined or otherwise formed with at least one through-opening 116 extending between upper surface 111U and opposing lower surface 111L. In some embodiments base structure 110 also includes an optional cap/cover structure 112 that mounts over lower surface 111L.

Sensor board 120 is mounted on/over upper surface 111U of support plate 111 such that, as indicated in FIG. 2B, at least a portion of sensor array 124 is pinched between support plate 111 and target object 90 during operable interactions. As indicated in FIG. 1, sensor board PCB 121 is planar/flat such that it is uniformly supported by planar upper surface 111U of support plate, and sensor array 124 includes pressure sensors 125 arranged in a 2D pattern (e.g., aligned in rows and columns forming a plane that is parallel to upper support plate surface 111U). Note that each pressure sensor 125 is supported by a corresponding region of upper support plate surface 111U and is configured to generate an associated pressure data value in response to an associated amount of contact force applied by target object 90 during operable interactions. For example, as indicated in the bubble portion of FIG. 2B, sensors 125-3 and 125-4 are disposed over upper surface portions 111U-3 and 111U-4, respectively, and generate pressure sensor values PSD-3 and PSD-4, respectively, in response to contact force components PFC-3 and PFC-4 that are respectively generated by corresponding portions of target object 90 and directed toward upper surface portions 111U-3 and 111U-4. In alternative embodiments (not shown), sensor array 124 may be implemented as a set of separate pressure sensors (i.e., not disposed on a single PCB structure), and/or may be arranged in another symmetric (i.e., equally-spaced) arrangement or an asymmetric or random pattern arrangement).

As indicated in the bubble of FIG. 1, sensor data processing circuit 130 is attached to the support plate 111 and is configured to generate tactile information TI in response to pressure sensor data PSD generated by the various pressure sensors 125 that form sensor array 124. Processing circuit 130 is further configured to transmit tactile information TI in a serial data stream (e.g., as part of a serial data signal transmitted using a standard serial data protocol) to control circuit 203 by way of signal wires/connectors of data bus 108. In a presently preferred embodiment, sensor data processing circuit 130 is mounted on lower (non-contacting) surface 111L of support plate 111, and pressure sensor data PSD generated by pressure sensors 125 is transmitted to processing circuit 130 by way of one or more mezzanine connectors 140 disposed in through-opening 116. With this arrangement, as indicated in FIGS. 2A and 2B, support plate 111 is disposed between target object 90 and sensor data processing circuit 130 during operable interactions (i.e., pressure force components PFC-3 and PFC-4 applied by target object 90 compresses sensor board 120 against support plate 111, but support plate 111 prevents these pressure force components from compressing sensor data processing circuit 130 by way of its rigid connection to finger 255-1).

FIGS. 3A and 3B are simplified cross-sectional views depicting the generation of tactile information by a tactile perception apparatus 100A configured in accordance with a simplified first specific embodiment of the present invention. FIG. 3A shows a cross-sectional portion of tactile perception apparatus 100A during an initial time period "t0" prior to contact with a target object, and FIG. 3B shows tactile perception apparatus 100A during a subsequent time period "t1" during contact with target object 90. For brevity and clarity, certain simplifications are utilized to describe the features and structures of tactile perception apparatus 100A (and those of tactile perception apparatus described in the embodiments provided below). For example, various structures of apparatus 100A are identified using the same reference numbers as those provided above with reference to FIGS. 1, 2A and 2B—it is understood that the re-use of reference numbers does not necessarily mean that the identified feature/structure is identical in both instances (e.g., pressure sensors 125-1 to 125-6 of apparatus 100A may differ from the pressure sensors utilized in the embodiments described above). Moreover, pressure forces applied by target objects are indicated using binary "1" to indicate a relatively high pressure force and binary "0" to indicate a relatively low pressure force, whereas in practical embodiments the pressure forces applied and measured by pressure sensors may be measured using a range of digital values to provide enhanced tactile information.

Referring to FIG. 3A, cross-sectional portion of apparatus 100A shows a portion of a pressure sensor array 124A including a column of pressure sensors 125-1 to 125-6 of sensor board 120A, which are disposed next to corresponding regions 155-1 to 155-6 of encapsulating layer 150A. In this embodiment, pressure sensors 125-1 to 125-6 are respectively configured to generate analog pressure sensor values PSA-1 to PSA-6, and sensor board 120A includes an analog-to-digital converter (ADC) circuit 126 that is mounted on PCB 121A and operably configured to receive analog pressure sensor values PSA-1 to PSA-6 via local signal lines 126. ADC circuit 126 is also configured to convert analog pressure sensor values PSA-1 to PSA-6 into corresponding digital pressure sensor values PSD-1 to PSD-6, and to transmit the pressure sensor values PSD-1 to PSD-6 to processing circuit 130A via mezzanine connector 140. For explanatory purposes, digital pressure sensor values PSD-1 to PSD-6 are depicted in a vertical column to indicate the one-to-one correspondence with analog pressure sensor values PSA-1 to PSA-6, and in a practical application are transmitted from ADC circuit 126 to processing circuit 130A via a single connector data signal line 145 of mezzanine connector 140.

In the embodiment depicted in FIGS. 3A and 3B, pressure sensors 125-1 to 125-6 are operably configured to generate corresponding analog pressure sensor data values PSA-1 to PSA-6 having magnitudes (amounts) determined by corresponding amounts of applied contact/pressure force. Referring to FIG. 3A, in the absence of an applied contact force at time t0 (e.g., the double-headed arrows indicating pressure force components PSA-1 and PSA-6 in FIG. 3A indicate zero applied pressure against encapsulation layer 150A), each pressure sensor 125-1 to 125-6 generates a relatively low analog (e.g., low voltage) pressure sensor data value, which is indicated by the letter "L" depicted in each pressure sensor 125-1 to 125-6. Conversely, as indicated in FIG. 3B, each pressure sensor that receives an applied pressure force component generates a relatively high analog (e.g., high voltage) pressure sensor data value, which is indicated by the letter "H" depicted in pressure sensors 125-3 to 125-6. Note that the pressure force components applied by target object 90 are generated when apparatus 100A is actuated such that encapsulating layer 150A is pressed against a surface portion of target object 90, as indicated in FIG. 3B. Note also that the magnitude of analog pressure sensor data values PSA-1 to PSA-6 only changes when a given pressure sensor receives an applied contact/pressure force component. That is, because the operable interaction involves only a lower portion of sensor board 120A (i.e., non-zero pressure force components PFC-3 to PFC-6 are applied to pressure sensors 125-3 to 125-6, respectively, and zero pressure force components PFC-1 and PFC-2 are applied to pressure sensors 125-1 and 125-2, respectively), magnitude changes only occur in the analog pressure sensor data values generated by pressure sensors 125-3 to 125-6. Accordingly, pressure sensors 125-1 to 125-6 respectively send analog pressure sensor values PSA-1 to PSA-6 having respective values "L", "L", "H", "H", "H" and "H" to ADC circuit 126 during time t1. As mentioned above, ADC circuit 126 then converts analog pressure sensor values PSA-1 to PSA-6 into corresponding digital pressure sensor values PSD-1 to PSD-6 (i.e., having a corresponding binary signal pattern "0", "0", "1", "1", "1" and "1") to processing circuit 130A.

Referring again to FIGS. 3A and 3B, encapsulating layer 150A acts like human skin by undergoing local elastic deformation in response to applied contact force components, thereby protecting pressure sensor array 124A from shock damage while enabling the generation of accurate pressure contact data during operable interactions. Specifically, FIG. 3A delineates six encapsulating layer regions 155-1 to 155-6 of encapsulating layer 150A, which are respectively disposed over pressure sensors 125-3 to 125-6, in a relaxed, decompressed state, which occurs in the absence of an applied contact force. In contrast, as indicated in FIG. 3B, when target object 90 contacts the lower portion of apparatus 100A, encapsulating layer regions 155-3 to 155-6 are elastically compressed by corresponding portions of target object 90, thereby damping mechanical shocks that could damage pressure sensors 125-3 to 125-6. When fully compressed, encapsulating layer regions 155-3 to 155-6 transmit applied pressure force components PFC-3 to PFC-6 to pressure sensors 125-3 to 125-6, thereby enabling the generation of high analog pressure sensor data values (i.e., analog pressure sensor values PSA-3 to PSA-6 have high "H" values). Note that, because target object 90 does not contact the upper portion of encapsulating layer 150A, contact force components PFC-1 and PFC-2 apply zero force magnitudes onto regions 155-1 and 155-2 (i.e, regions 155-1 and 155-2 remain in the relaxed, decompressed state during time t1, as shown in FIG. 3B), which in turn causes pressure sensors 125-1 and 125-2 to maintain low analog pressure sensor data values (i.e., analog pressure sensor values PSA-1 and PSA-2 have low "L" values).

In one embodiment, processing circuit 130A utilizes a microprocessor 135 or other logic circuit to generate tactile information TI corresponding to the contour-map-type information provided by digital pressure sensor values PSD-1 to PSD-6. For example, when an all-binary-zero digital pressure sensor value pattern is generated by ADC circuit 126 in the absence of applied contact force (e.g., as depicted in FIG. 3A), microprocessor 135 may be configured to generate/transmit tactile information TI having a data pattern that is interpreted by a host robotic system's control circuit as indicating "no contact". Conversely, when an applied contact force is detected (e.g., as depicted in FIG. 3B) microprocessor 135 may be configured to generate/transmit tactile information TI having a pattern that indicates the location and orientation of the contacted target object (e.g., "contact on lower two-thirds of column", thereby allowing the host robotic system's control circuit to continue programmed operations when expected feedback data is provided, or to take corrective action when undesirable contact between the gripper and target object is indicated. For example, FIG. 4A is a simplified diagram depicting an exemplary 2D contour-map-type pressure sensor data pattern PSD-P1 that is generated by pressure board 120A(t1) when target object 90 contacts a central portion of pressure sensor array 124A, which includes pressure sensors PSD-11 to PSD-56 arranged in five columns C1 to C5 and six rows R1 to R6, and digital pressure sensor values generated in the manner described above are superimposed on each pressure sensor PSD-11 to PSD-56 for explanatory purposes. FIG. 4A depicts an exemplary expected feedback data pattern PSD-P1 generated when target object 90 contacts pressure sensors 125-33 to 125-36 disposed in central column C3 (i.e., as indicated by contact region CR-1 and pressure sensor data values PSD-33 to PSD-36), whereby microprocessor 135 may be configured to generate/transmit tactile information TI having a pattern that indicates the central location and vertical orientation of target object 90, thereby allowing the host robotic system's control circuit to continue programmed operations (i.e., perform a primary control signal sequence defined by user provided instructions 207 without interruption). In contrast, FIG. 4B depicts an exemplary unexpected feedback data pattern PSD-P2 generated when target object 90 is offset from the expected central location, and contacts pressure sensors 125-53 to 125-56 disposed in edge column C5 (i.e., as indicated by contact region CR-2). In this case, microprocessor 135 generates/transmits tactile information TI having a pattern that indicates the off-center location and vertical orientation of target object 90, thereby allowing the host robotic system's control circuit to interrupt the primary control signal sequence (programmed operation) to include one or more secondary control signals that re-adjust the gripper's position relative to the target object. Similarly, FIG. 4C depicts an exemplary unexpected feedback data pattern PSD-P3 generated by pressure sensor array 124A when target object 90 is offset such that it contacts pressure sensors disposed in multiple rows R3 to R6 and multiple columns C2 to C4 (i.e., as indicated by contact region CR-3). In response to this offset condition, microprocessor 135 generates/transmits tactile information TI having a pattern that indicates the off-center location and/or non-vertical orientation of target object 90, thereby allowing the host robotic system's control circuit to interrupt the primary control signal sequence to take corrective action (e.g., rotate and reposition the fingers before re-grasping the target object).

Figure 5A:
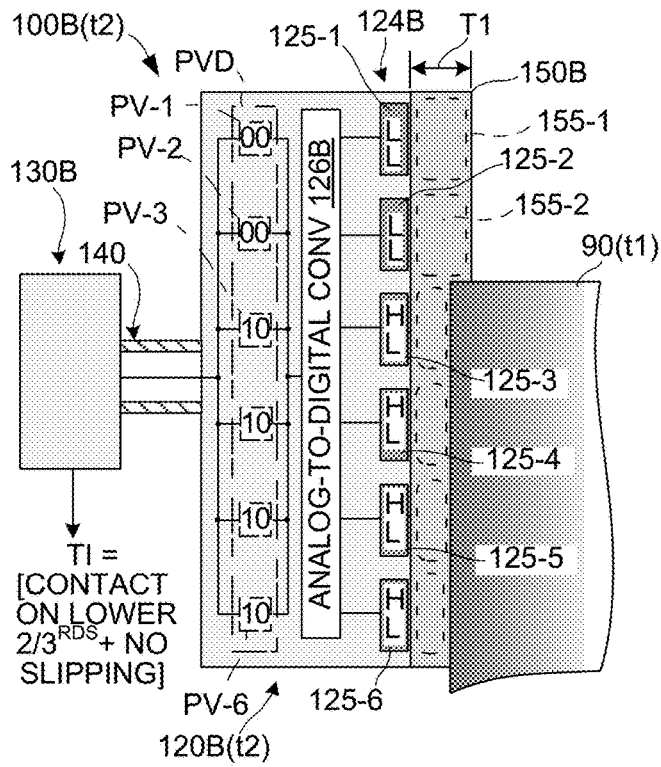
FIGS. 5A and 5B are cross-sectional side views depicting a simplified tactile perception apparatus according to a second specific embodiment of the present invention.
Figure 5B:
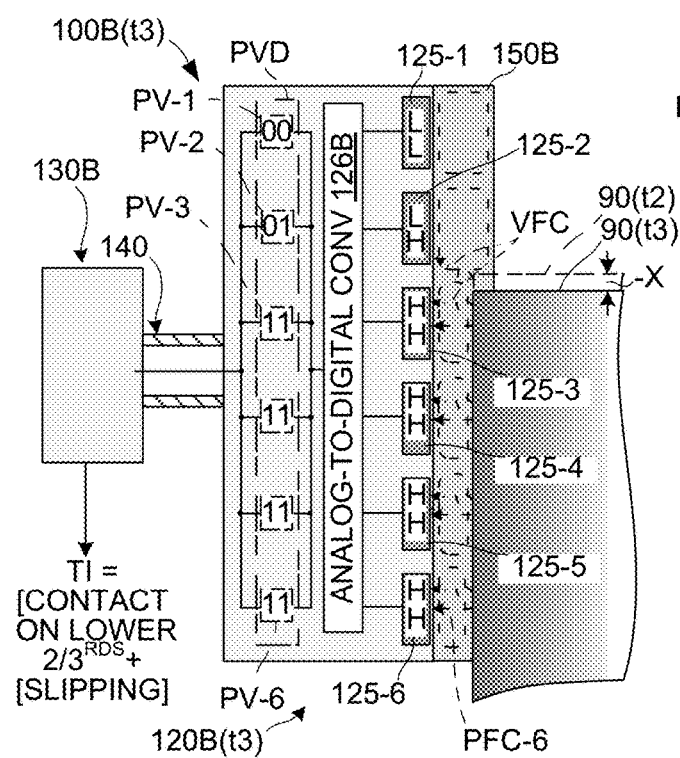

FIGS. 5A and 5B depict a simplified tactile perception apparatus 100B according to another specific embodiment. Apparatus 100B includes a sensor board 120B, a sensor data processing circuit 130B, a mezzanine connector 140 and an encapsulating layer 150B that are similar to apparatus 100A (described above) and is depicted in FIG. 5A as performing the operable interaction as that described above with reference to FIG. 3B. As such, details of apparatus 110B that are the same as those described above with reference to apparatus 100A are omitted for brevity.

Apparatus 100B differs from apparatus 100A in that encapsulating layer 150B is formed in accordance with specific material parameters that allow it to perform the protection and grasping friction functions described above, and to further function as a speaker-like mechanism that generates a high/low pressure wave front in response to slipping-type displacement of target object 90. Referring to FIG. 5A, in this embodiment encapsulating layer 150B is implemented using a layer of silicone rubber having a thickness T1 in the range of 0.5 mm to 10 mm and a material formulation characterized by having a surface roughness from 0 to 300 microns RMS (root mean square) and a durometer of 30 A to 70 A. When fabricated using these parameters, encapsulating layer 150B functions as a medium that transmits to sensor board 120B a high/low pressure wave front generated by slipping-type displacement of target object 90 as described with reference to FIGS. 6A and 6B.

Sensor board 120B and processing board 130B also differ somewhat from corresponding circuits of apparatus 100A to facilitate detection/measurement of high/low pressure wave fronts generated by encapsulating layer 150B. Sensor board 120B is similar to sensor board 120A in that pressure sensors 125-1 to 125-6 of pressure sensor array 124B are configured to measure static pressure sensor data values as described above, but differs in that pressure sensors 125-1 to 125-6 are also configured to measure vibration force values in accordance with the generation of high/low pressure wave fronts by encapsulating layer 150B in response to slipping-type displacement of target object 90. Similarly, processing circuit 130B differs from processing circuit 130A in that it is configured to generate tactile information TI using both the static pressure force values and the vibration force values (collectively referred to as pressure/vibration PV values). For brevity and to simplify the following description, both the static pressure sensor data values and the vibration force values are described using binary-one and binary-zero values. For example, as indicated in FIG. 5A, pressure/vibration value PV-1, which is generated by ADC circuit 126B based on corresponding analog data values generated by pressure sensor 125-1, is indicated by "00", where the first binary-zero value is the pressure sensor data value and the second binary-zero value is the vibration force value. Those skilled in the art will recognize that, in practical applications, the static pressure and vibration force values can be represented by other numeric scales and can be time variant.

Figure 6A:
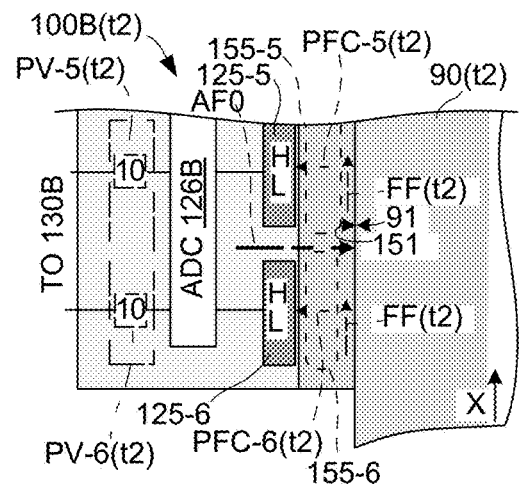
FIGS. 6A, 6B and 6C are cross-sectional views depicting the generation of exemplary tactile information indicating both static position and dynamic movement (slipping) of a target object using pressure sensor data generated by the tactile perception apparatus of FIGS. 5A and 5B.

FIGS. 5A and 6A show apparatus 100B at a time t2 when target object 90 is securely grasped (i.e., no slipping of target object 90 is occurring at time t2). That is, as indicated in FIG. 6A, applied force AF0 is great enough at time t2 to generate a friction force FF between surface 151 of encapsulating layer 150B and surface 91 of target object 90 that is sufficient to maintain the X-axis position of object 90 relative to apparatus 100B. In this state pressure sensor array 124B generates/transmits pressure/vibration values that reflect the corresponding to the pattern of contact forces applied by object 90 and the no-slipping state. For example, as indicated in FIG. 6A, pressure sensors 125-5 and 125-6 respectively receive pressure force components PFC-5 and PFC-6 from compressed encapsulation layer regions 155-5 and 155-6, and therefore generate high "H" analog pressure values. At the same time, due to the absence of vibration force, pressure sensors 125-5 and 125-6 generate low "L" analog vibration values. Accordingly, pressure force components PFC-5 and PFC-6 respectively generate analog pressure/vibration values having the value "HL", whereby ADC circuit 126B converts these values into pressure/vibration values PV-5 and PV-6 equal to binary "10" at time t2. Referring to FIG. 5A, in a similar manner, pressure sensors 125-3 and 125-4 also generate "HL" pressure/ vibration values, which are converted to binary "10" values by ADC circuit 126B, and then transmitted to processing circuit 130B. In contrast, because pressure sensors 125-1 and 125-2 do not receive pressure force components at time t2, these sensors generate "LL" pressure/vibration values that are converted/transmitted by ADC circuit 126B as binary "00".

Figure 6B:
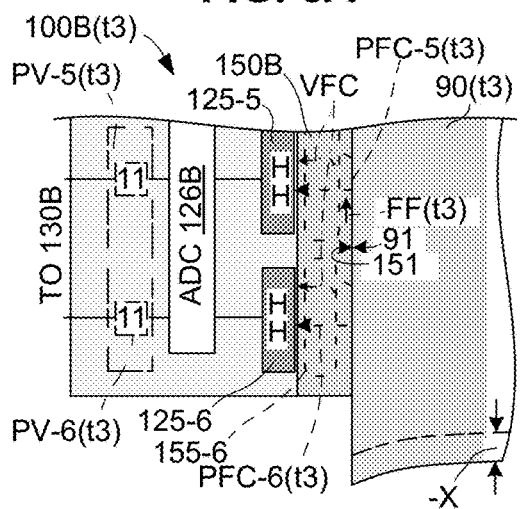

FIGS. 5B and 6B show apparatus 100B at a time t3 when target object 90 has slipped a distance −Z from its position at time t2. That is, as indicated in FIG. 6B, at time t3 a friction force FF between surface 151 of encapsulating layer 150B and surface 91 of target object 90 is insufficient to maintain the X-axis position of object 90 relative to apparatus 100B, whereby target object 90 begins to displace in the −Z direction (i.e., to slip downward relative to apparatus 100B, where the −Z direction is lateral to surface 151 of encapsulating layer 150B and parallel to pressure sensors 125-5 and 125-6). During the slipping process, encapsulation layer regions 155-5 and 155-6 continue to transmit static pressure force components PFC-5 and PFC-6 to pressure sensors 125-5 and 125-6. In addition, encapsulation layer regions 155-5 and 155-6 function to transmit vibration force components VFC that are also detected by pressure sensors 125-5 and 125-6, where vibration force components VFC represent a high/low alternating pressure wave front generated by the slipping-type contact between object surface 91 and encapsulation layer surface 151 while object 90 is moving in the −Z direction relative to encapsulation layer 150B. As such, pressure sensor array 124B generates/transmits pressure/vibration values that correspond to the pattern of contact forces applied by object 90 and the slipping state indicated by vibration force components VFC. For example, as indicated in FIG. 6B, pressure sensors 125-5 and 125-6 respectively generate analog pressure/vibration values having the value "HH", whereby ADC circuit 126B converts these values into pressure/vibration values PV-5 and PV-6 equal to binary "11" at time t3. Referring to FIG. 5B, in a similar manner, pressure sensors 125-3 and 125-4 also generate "HH" pressure/vibration values, which are converted to binary "11" values by ADC circuit 126B, and then transmitted to processing circuit 130B. Pressure sensors 125-1 and 125-2 do not receive pressure force components at time t3, but may detect the vibrations generated during the slipping process, whereby pressure sensor 125-1 generates an "LL" pressure/vibration value and pressure sensor 125-2 generates a "LH" pressure/vibration value, which are then converted/transmitted by ADC circuit 126B to pressure/vibration values PV-1 and PV-2 having binary values of "00" and "01", respectively.

Figure 6C:
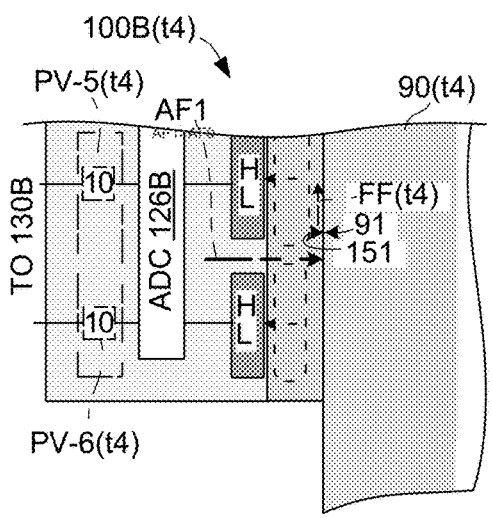

By facilitating early detection of the slipping event described in FIG. 5B, apparatus 100B facilitates corrective action to arrest the slipping process, thereby preventing damage to target object 90 (i.e., by way of breakage than can occur when object 90 entirely slips from the grasp applied by way of apparatus 100B). That is, by configuring processing circuit 130B to generate tensile information TI including both the static pressure information described above along with slip/no-slip information, apparatus 100B is able to notify a host robotic system's control circuit immediately after slipping begins, thereby facilitating corrective action. For example, FIG. 6C shows a portion of apparatus 100B at a time t4 (i.e., immediately after time t3), when the end effector upon which apparatus 100B is mounted is actuated to generate an increased applied force AF1 on object 90, thereby increasing the amount of friction force FF between encapsulation surface 151 and object surface 91 to a level that stops the slipping process. Successful termination of the slipping process is verified, for example, by the change in pressure/vibration values PF-5 and PF-6 to the "10" binary values described above with reference to FIG. 5A.

Figure 7:
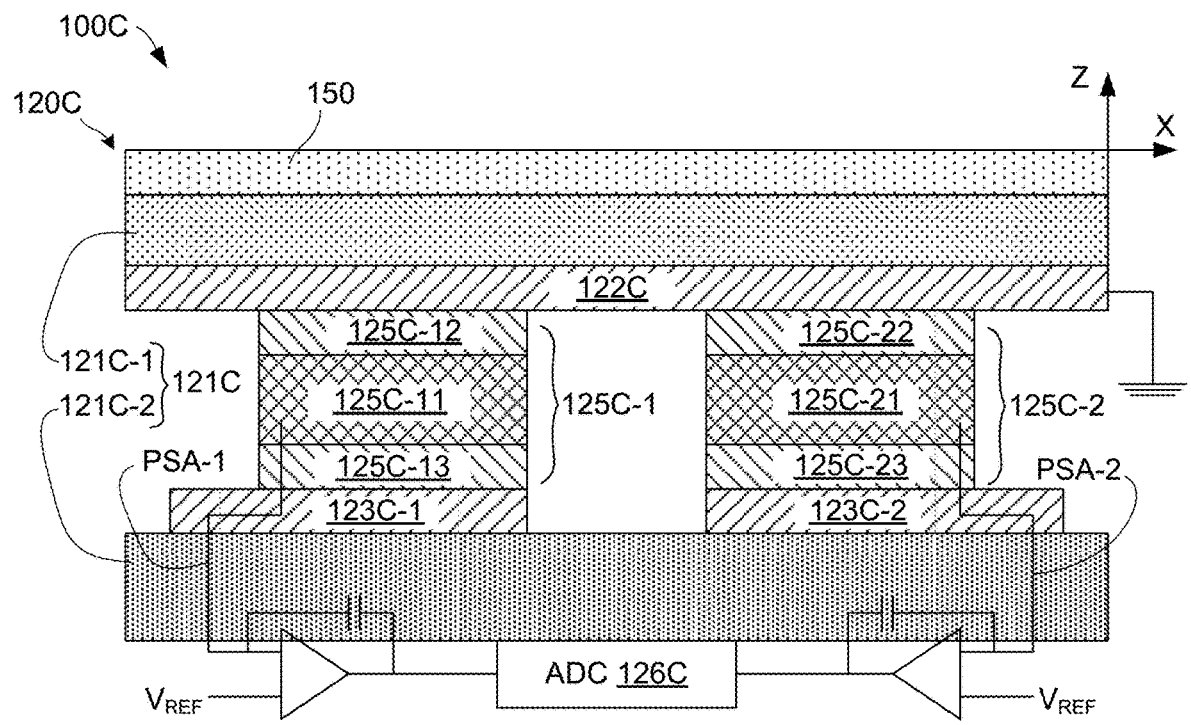
FIG. 7 is a cross-sectional side view showing two PZT-type pressure sensors of a tactile perception apparatus according to another specific embodiment.

FIG. 7 is a cross-sectional side view showing a portion of an exemplary sensor board 120C including two piezoelectric-type pressure sensors 125C-1 and 125C-2 sandwiched between two PCB stack-up structures (stack-ups) 121C-1 and 121C-2 that collectively form a multi-layer PCB structure 121C. In the exemplary embodiment, pressure sensors 125C-1 and 125C-2 respectively comprise piezoelectric material structures 125C-11 and 125C-21 (e.g., small blocks/dies of lead zirconate titanate (PZT)) that are respectively sandwiched between upper electrodes 125C-12 and 125C-22 and lower electrodes 125C-13 and 125C-23, which are operably coupled to upper conductive leads/circuitry 122C formed on a lower surface of PCB stack-up 121C-1 and lower leads/circuitry 123C-1 and 123C-2 formed on an upper surface of PCB stack-up 121C-2. In one embodiment PZT structures 125C-11 and 125C-21 are fabricated such that their poling direction is in the vertical direction facing away from lower PCB stack-up 121C-2 at normal incidence (i.e., in the Z-axis direction). In other embodiments, the poling directions of PZT structures 125C-11 and 125C-21 may be directed along other axes. In one embodiment upper PCB stack-up 121C-1 comprises one or more layers of a flexible PCB material (e.g., polyimide polymer) to facilitate the transfer of pressure forces to pressure sensors 125C-1 and 125C-2. In the exemplary embodiment, upper circuitry 122C includes a shared conductive structure that is connected to a ground potential during operation, and each of lower circuitry 123C-1 and 123C-2 includes a separate amplification circuit (e.g., such as the op-amp and capacitor arrangement indicated in FIG. 7) that facilitate the transfer of analog sensor data signals from sensors 125C-1 and 125C-2 to ADC circuit 126C. When apparatus 100C is implemented using the exemplary configuration shown in FIG. 7, pressure forces applied by a target object (not shown) onto upper PCB stack-up 121C-1 during operation are transmitted to sensors 125C-1 and 125C-2 (e.g., by compressing corresponding regions of encapsulating layer 150), thereby causing PZT structures 126C-1 and 126C-2 to generate associated analog pressure sensor data values PSA-1 and PSA-2 in the form of electric charges that are produced in accordance with the piezoelectric effect and have corresponding magnitudes related to corresponding amounts of Z-axis deformation (compression) of PZT structures 126C-1 and 126C-2. As with previously described embodiments, the structure depicted in FIG. 7 is simplified to highlight notable features of the present invention, and that the depicted structure forms part of a larger pressure sensor array, which in turn may form part of a sensor board that includes one or more additional PCB stack-ups or PCB layers and additional sensor types.

Figure 8:
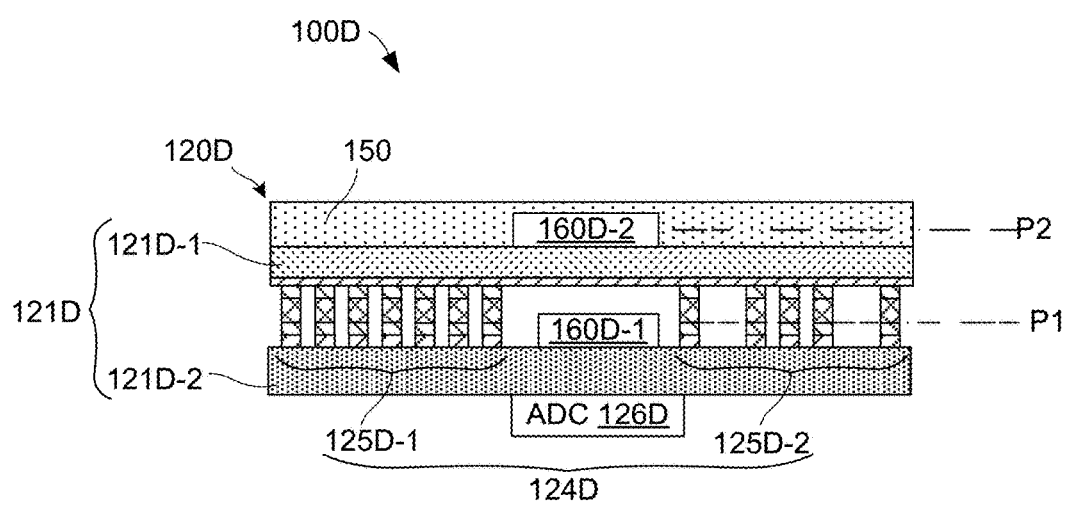
FIG. 8 is a cross-sectional side view depicting a simplified sensor board of a tactile perception apparatus according to another specific embodiment.

FIG. 8 is a cross-sectional side view depicting a simplified sensor board 120D, which forms part of a tactile perception apparatus 100D according to another exemplary embodiment. Like the embodiment shown in FIG. 7, sensor board 120D includes pressure sensors 125D-1 and 125D-2 disposed between PCB stack-ups 121D-1 and 121D-2, which collectively form a multi-layer PCB structure 121D. Pressure sensors 125D-1 and 125D-2 may be implemented using the PZT-type sensor configuration described above with reference to FIG. 7, and may be disposed on first PCB structure 121D in either a symmetric (i.e., equally-spaced) pattern arrangement (e.g., as indicated by sensors 125D-1 in FIG. 8), or an asymmetric/random pattern arrangement (e.g., as indicated by sensors 125D-2 in FIG. 8). As in previous embodiments, analog pressure sensor data values are passed to an ADC circuit 126D disposed on a lower surface of PCB stack-up 121D-2. In alternative embodiments, pressure sensors 125D-1 and 125D-2 may be implemented using one or more sensors of another sensor type (e.g., one of a strain gauge, a capacitive pressure sensor, a cavity-based pressure sensor, a piezoelectric sensor and a piezoresistive sensor).

Sensor board 120D differs from above-described embodiments in that it includes one or more additional sensors 160D-1 and 160D-2 disposed on PCB structure 121D and configured to provide additional data utilized in the generation of tactile information. Additional sensors 160D-1 and 160D-2 are implemented by sensor types that differ from the pressure sensors of pressure sensor array 124D (e.g., additional sensors 160D-1 and 160D-2 may comprise either a vibration/texture sensor configured to detect vibrations in the manner described above with reference to FIGS. 5A-6C, a proximity sensor configured to determine distances between a target object and sensor board 120D, or a temperature sensor configured to generate temperature data in response to a local temperature applied to a corresponding portion of the sensor board temperature sensors). In some embodiments, one or both of additional sensors 160D-1 and 160D-2 comprise vibration/texture sensors that are implemented using either piezoelectric, piezoresistive or MEMS-based sensor configurations. In other embodiments, one or both of additional sensors 160D-1 and 160D-2 comprise temperature sensors implemented using resistive temperature detectors (RTD), thermoelectric, or another known temperature sensor configurations. In yet other embodiments, one or both of additional sensors 160D-1 and 160D-2 comprise proximity sensors implemented using capacitive-coupling-type sensing elements. As indicated in FIG. 8, additional sensor 160D-1 is disposed on the upper surface of PCB stack-up 121D-2 (i.e., in the same physical layer/plane, indicated by dash-dot-line P1, that includes pressure sensor array 124D), and additional sensor 160D-2 is disposed on upper surface of PCB stack-up 121D-1 (i.e., in a different physical layer/plane, indicated by dash-dot-line P2, from that occupied by pressure sensor array 124D). In some embodiments, additional sensor 160D-1 includes circuitry that is self-contained within layer P1, and additional sensor 160D-2 includes circuitry that is self-contained within layer P2. In some embodiments, additional sensors 160D-1 and 160D-2 are operably coupled to ADC circuit 126D, and ADC circuit 126D is configured to generate tactile information using both the pressure data received from array 124D and the additional data received from additional sensors 160D-1 and 160D-2.

Figure 9:
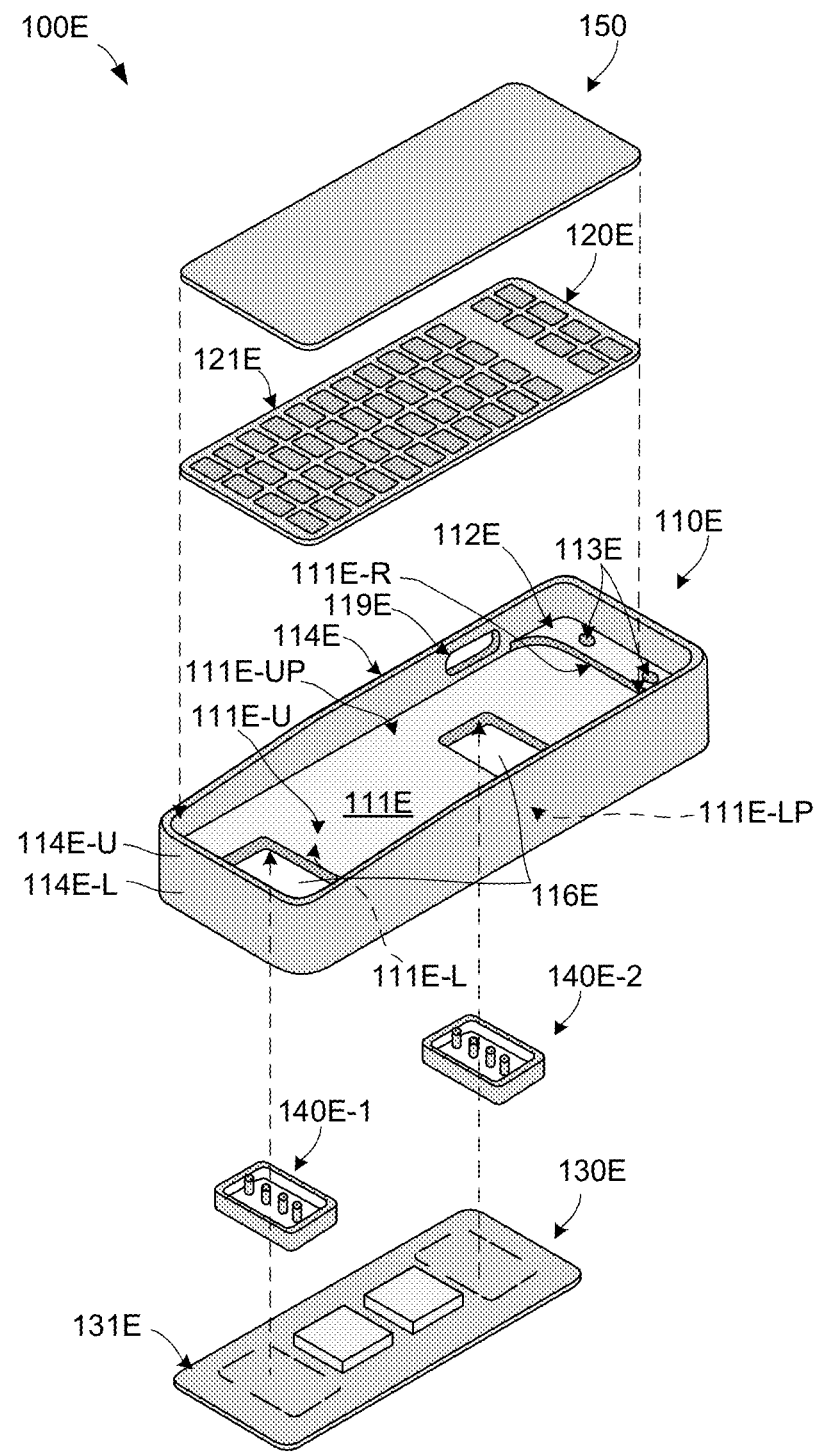
FIG. 9 is an exploded perspective view depicting a tactile perception apparatus according to another specific embodiment.
Figure 10A:
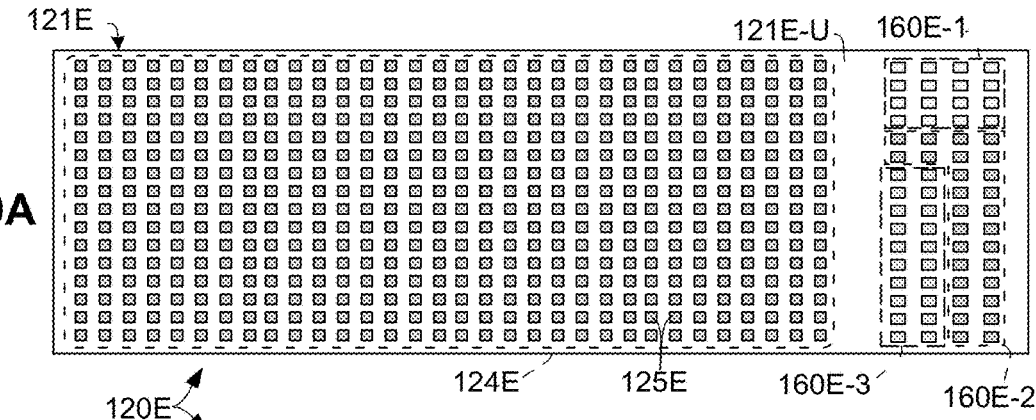
FIGS. 10A and 10B are top and bottom plan views, respectively, depicting a sensor board of the tactile perception apparatus of FIG. 9.
Figure 10B:
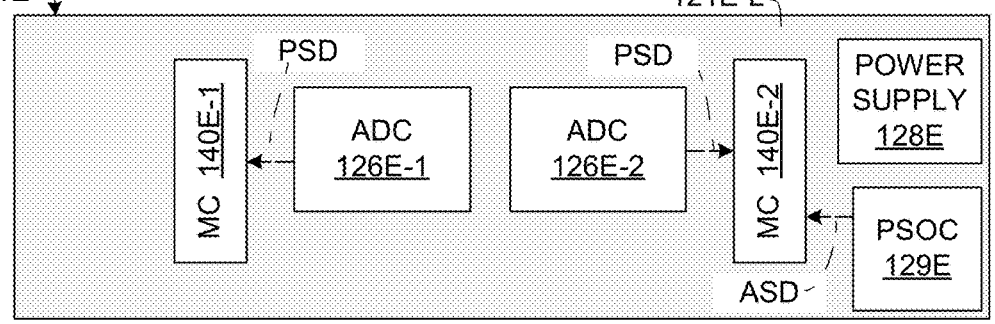
Figure 11A:
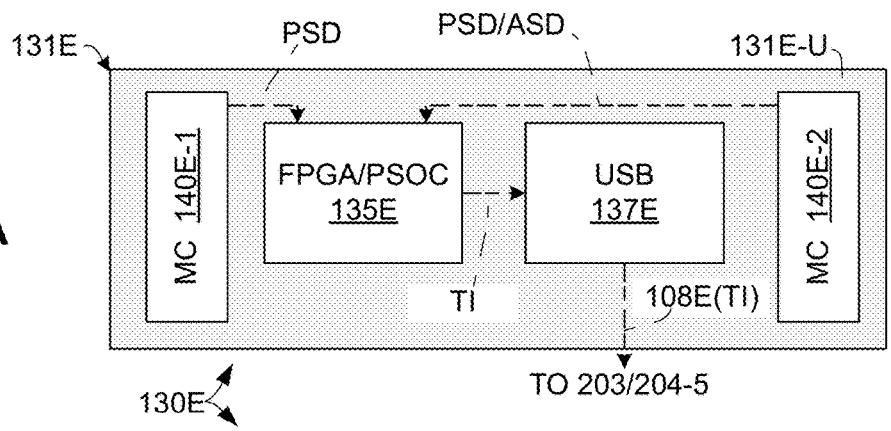
FIGS. 11A and 11B are top and bottom plan views, respectively, depicting a sensor data processing circuit of the tactile perception apparatus of FIG. 9.
Figure 11B:
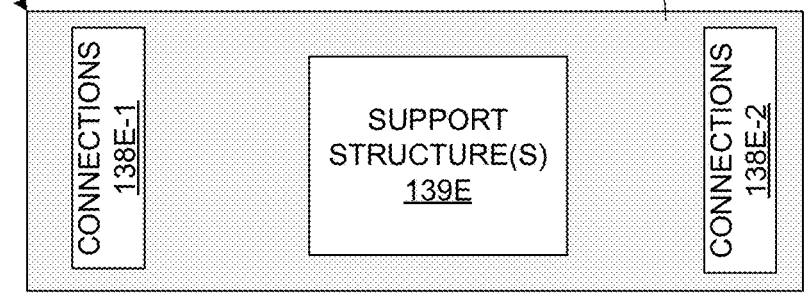
Figure 12:
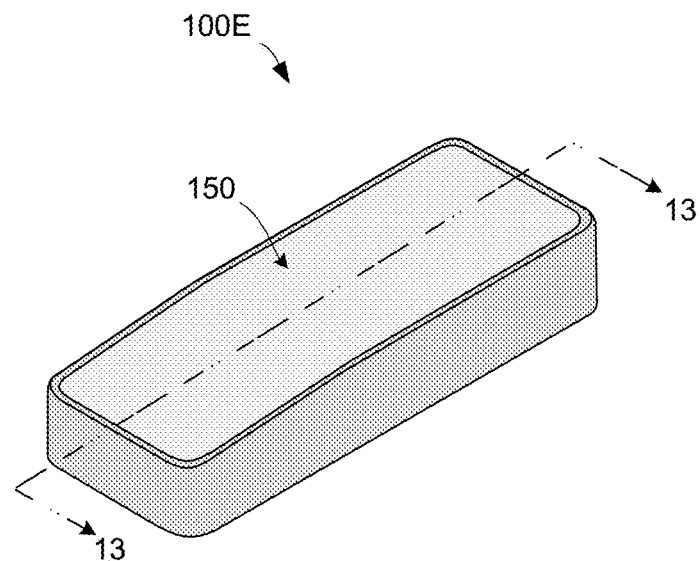
FIG. 12 is a perspective view showing the tactile perception apparatus of FIG. 9 in an assembled state.
Figure 13:
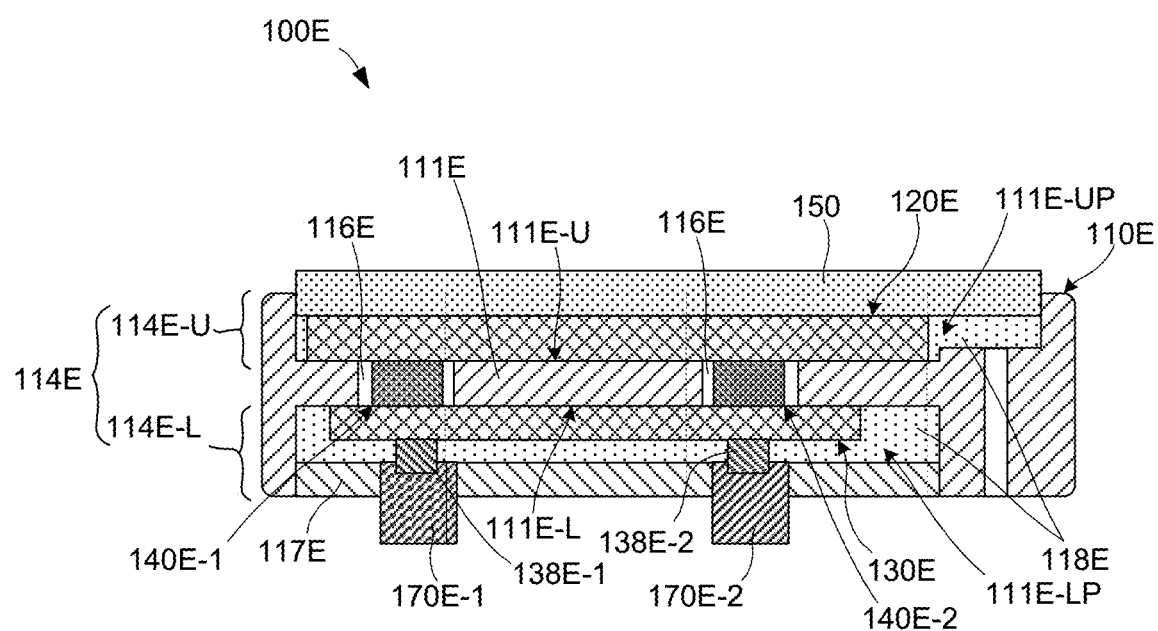
FIG. 13 is a cross-sectional side view showing the tactile perception apparatus of FIG. 12.

FIGS. 9 to 13 depict a tactile perception apparatus 100E configured in accordance with another exemplary embodiment. Referring to FIG. 9, tactile perception apparatus 100E includes a base structure 110E, a sensor board 120E, a sensor data processing circuit 130E, two mezzanine connectors 140E-1 and 140E-2, and an encapsulating layer 150. As set forth below, FIGS. 10A and 10B provide details regarding the circuits and structures mounted on sensor board 120E, FIGS. 11A and 11B provide details regarding sensor data processing circuit 130E, and FIGS. 12 and 13 depict perspective and cross-sectional side views of tactile perception apparatus 100E in an assembled state. Referring to FIG. 9, base structure 110E comprises a machined or molded metal (e.g., aluminum or steel) structure including a support plate 111E having two through-openings 116E extending between a planar upper surface 111E-U and an opposing planar lower surface 111E-L, a mounting flange 112E integrally connected to a rear edge 111E-R of support plate 111E and including mounting holes 113E configured for rigid connection of base structure 111E to a robotic gripper (not shown), for example, by way of bolts or other fasteners. An integral peripheral wall 114E surrounds support plate 111E and mounting flange 112E and, as indicated in FIG. 12, forms a protective housing that, in combination with encapsulation layer 150, surrounds and protects sensor board 120E and processing circuit 130E. As indicated in FIGS. 9 and 13, an upper wall portion 114E-U of peripheral wall 114E extends perpendicular to and upward from (above) support plate 111E-U, whereby upper support plate surface 111E-U and an inside surface of upper wall portion 114E-U form an upper pocket region 111E-UP configured to receive and secure sensor board 120E. Similarly, a lower wall portion 114E-L of peripheral wall 114E extends perpendicular to and downward from (below) support plate 111E-U, whereby lower support plate surface 111E-L and an inside surface of lower wall portion 114E-L form a lower pocket region 111E-LP configured to receive and secure processing circuit 130E. Encapsulating layer 150 may be implemented using any of the embodiments described above.

FIGS. 10A and 10B are upper/lower plan views depicting sensor board 120E in additional detail, with FIG. 10A depicting features disposed on or near upper surface 121E-U, and FIG. 10B depicting features disposed on a lower surface 121E-L of PCB structure 121E. Referring to FIG. 10A, sensor board 120E includes a pressure sensor array 124E having 512 pressure sensors 125E disposed in sixteen rows and thirty-two columns, and additional sensors 160E-1, 160E-2 and 160E-3 disposed at one end of PCB structure 121E. A first ADC circuit 126E-1 is configured to receive pressure sensor data from a first half of pressure sensors 125E and to generate corresponding digital pressure sensor data PSD, which is then transmitted to processing circuit 130E by way of mezzanine connector 140E-1. A second ADC circuit 126E-2 is configured to receive pressure sensor data from the other (second) half of pressure sensors 125E and to generate corresponding digital pressure sensor data that is transmitted to processing circuit 130E by way of mezzanine connector 140E-2. A programmable device (e.g., a PSOC) 129E is operably configured to control operations performed by additional sensors 160E-1, 160E-2 and 160E-3 and to generate digital additional sensor data ASD, which is then transmitted to processing circuit 130E by way of mezzanine connector 140E-2. Optional additional circuits mounted on PCB structure 121E include a power supply 128E configured to provide optimal reference voltages to the various sensors.

FIGS. 11A and 11B are upper/lower plan views depicting sensor data processing circuit 130E in additional detail, with FIG. 11A depicting features disposed on or near upper surface 131E-U of PCB structure 131E, and FIG. 11B depicting features disposed on a lower surface 131E-L of PCB structure 131E. Referring to FIG. 11A, pressure sensor data PSD and additional sensor data ASD transmitted from sensor board 120E by way of mezzanine connectors 140E-1 and 140E-2 is provided to a programmable device (e.g., an FPGA or PSOC) 135E, which is configured to process the data and to generate tactile information TI. Programmable device 135E transmits tactile information TI to a suitable transceiver circuit (preferably a USB circuit produced in accordance with known techniques) 137E that transmits tactile information TI as a serial data stream on a standard USB signal line (data bus) 108E.

FIGS. 12 and 13 depict assembled tactile perception apparatus 100E in perspective and simplified cross-section, respectively (note that signal lines are omitted for clarity). During assembly, sensor board 120E and processing circuit 130E are respectively mounted into upper pocket region 111-UP and lower pocket region 111-LP and connected by mezzanine connectors 140E-1 and 140E-1, which extend through respective openings 116E. Encapsulating layer 150 may be either pre-attached to sensor board 120E or formed after sensor board 120E is mounted into base 110E. An optional lower cap 117E (shown in FIG. 13) is then secured over lower pocket region 111-LP. In one embodiment, lower cap 117E includes one or more external sockets 170E-1 and 170E-2 that operably couple to processing board 130E by way of connections 138E-1 and 138E-2. Once assembled, a potting material 118E is injected through a side opening 119E (shown in FIG. 9) into open (unoccupied) portions of pocket regions 111E-UP and 111E-LP to provide additional mechanical support and to enhance heat transfer from sensor board 120E and processing circuit 130E to support plate 111E.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with specific reference to articulated-type robotic systems that use two-finger end effectors, the tactile perception apparatus disclosed herein may also be beneficially utilized in advanced robotic systems that utilize three, four or five finger end effectors (e.g., human-like robotic hands). Moreover, the tactile perception apparatus configurations described herein may be modified to include one or more features associated with the flex-rigid sensor array structures described in co-owned and co-filed U.S. patent application Ser. No. 16/832,755 entitled "FLEX-RIGID SENSOR ARRAY STRUCTURE FOR ROBOTIC SYSTEMS", now U.S. Pat. No. 11,413,760, which is incorporated herein by reference in its entirety.

The invention claimed is:

1. An apparatus for providing tactile information to a control circuit of a robotic system, the robotic system including a robot arm mechanism having a distal end effector, the control circuit being configured to actuate the robot arm mechanism such that the end effector contacts a target object during a corresponding operable interaction, wherein said apparatus comprises:
   a base structure including a support plate configured for fixed connection to the end effector, said support plate having an upper surface and an opposing lower surface, the base structure being configured such that, during said operable interaction, said upper surface faces the target object and said lower surface faces away from the target object;
   a pressure sensor array mounted onto the upper surface of the support plate and including a plurality of pressure sensors arranged such that each said pressure sensor is disposed over a corresponding upper surface region of the support plate, wherein each said pressure sensor of said pressure sensor array is configured to generate an associated pressure data value in response to an associated amount of contact force applied by said target object and directed toward said corresponding upper surface region of the support plate during said operable interaction; and
   a processing circuit attached to the support plate and configured to generate said tactile information in response to said pressure data values generated by said plurality of pressure sensors, wherein the support plate defines at least one through-opening extending between said upper surface and said opposing lower surface, wherein said processing circuit is mounted on the lower surface of the support plate, and wherein the apparatus further comprises a mezzanine connector at least partially disposed in said opening and configured to transmit said plurality of pressure sensor data values to the processing circuit.

2. The apparatus of claim 1, wherein the support plate is configured such that the upper surface is planar, and wherein the pressure sensor array is disposed on a first printed circuit board (PCB) structure, thereby forming a planar sensor board that is substantially entirely supported by the planar upper surface of the support plate.

3. The apparatus of claim 2, wherein the sensor board further comprises an analog-to-digital converter (ADC) circuit that is mounted on the first PCB structure and is configured to both convert said analog pressure sensor values generated by said plurality of pressure sensors into corresponding digital pressure sensor values, and to serially transmit the digital pressure sensor values to the processing circuit by way of the mezzanine connector.

4. The apparatus of claim 2, further comprising a encapsulating layer disposed on an upper surface of the first PCB structure, said encapsulating layer consisting of a flexible material that elastically deforms in response to said contact force applied by said target object onto the pressure sensor array during said operable interaction.

5. The apparatus of claim 4, wherein said encapsulating layer comprises a flexible material layer having a thickness in the range of 0.5 mm to 10 mm and a material formulation characterized by having a surface roughness from 0 to 300 microns RMS and a durometer of 30 A to 70 A.

6. The apparatus of claim 2, wherein each of said plurality of pressure sensors comprises one of a strain gauge, a capacitive pressure sensor, a cavity-based pressure sensor, a piezoelectric sensor and a piezoresistive sensor, and wherein said plurality of pressure sensors are disposed in one of a symmetric arrangement, an asymmetric arrangement and a random pattern arrangement on said first PCB structure.

7. The apparatus of claim 6, wherein the first PCB structure comprises a first PCB stack-up and a second PCB stack-up, and wherein each of said plurality of pressure sensors comprises a piezoelectric material structure sandwiched between said first and second PCB stack-ups.

8. The apparatus of claim 7, further comprising at least one additional sensor mounted on the first PCB structure, wherein said additional sensor comprises at least one of a vibration sensor, a proximity sensor and a temperature sensor.

9. The apparatus of claim 8, wherein said at least one additional sensor is disposed on the first PCB stack-up such that said at least one additional sensor and said plurality of pressure sensors are disposed in a single plane.

10. The apparatus of claim 8, wherein said at least one additional sensor is disposed on the second PCB stack-up such that said at least one additional sensor and said plurality of pressure sensors are disposed in two or more planes.

11. The apparatus of claim 8, wherein said sensor board further comprises at least one of:

a second ADC circuit disposed on the first PCB structure and operably configured to convert analog signals generated by said at least one additional sensor; and a programmable device operably configured to control operations performed by at least one of said pressure sensor array and said at least one additional sensor.

12. The apparatus of claim 11, wherein said processing circuit comprises:

a second PCB structure;

a programmable logic device mounted on the second PCB structure and operably configured to generate said tactile information in response to both said plurality of pressure sensor data values and additional sensor signals generated by said at least one additional sensor; and a Universal Serial Bus (USB) circuit configured to transmit said tactile information onto a USB signal line.

13. The apparatus of claim 12, wherein the base structure consists essentially of metal and configured such that the lower surface of the support plate is planar, and wherein the second PCB structure of the processing circuit is mounted flush against the lower surface.

14. The apparatus of claim 13, wherein the base structure further comprises a mounting flange integrally connected to a rear edge of the support plate, said mounting flange defining mounting holes configured for rigid connection of the base structure to a robotic gripper finger.

15. The apparatus of claim 13, wherein the base structure further comprises peripheral walls disposed along peripheral edges of the support plate, thereby forming upper and lower pocket regions configured such that, when said sensor board and said processing circuit are respectively disposed in said upper and lower pocket regions, inside surfaces of said peripheral walls surround peripheral edges of said first and second PCB structures, and wherein said apparatus further comprises a potting material disposed in regions of said upper and lower pocket regions that are not occupied by said sensor board and said processing circuit.

16. A robotic system including a robot mechanism and a control circuit, said robot mechanism including an end effector configured to engage and manipulate a target object in response to control signals generated by the control circuit, wherein said robotic system comprises one or more tactile perception apparatus fixedly connected to the end effector, wherein each said tactile perception apparatus comprises:

a base structure including a support plate configured for fixed connection to the end effector, said support plate having an upper surface and an opposing lower surface, the base structure being configured such that, during said operable interaction, said upper surface faces the target object and said lower surface faces away from the target object;

a pressure sensor array mounted onto the upper surface of the support plate and including a plurality of pressure sensors arranged such that each said pressure sensor is disposed over a corresponding upper surface region of the support plate, wherein each said pressure sensor of said pressure sensor array is configured to generate an associated pressure data value in response to an associated amount of contact force applied by said target object and directed toward said corresponding upper surface region of the support plate during said operable interaction; and a processing circuit attached to the support plate and configured to generate said tactile information in response to said pressure data values generated by said plurality of pressure sensors, said processing circuit being further configured to transmit said tactile information as a serial data signal to the control circuit, wherein the support plate defines at least one through-opening extending between said upper surface and said opposing lower surface, wherein said processing circuit is mounted on the lower surface of the support plate, and wherein the apparatus further comprises a mezzanine connector at least partially disposed in said opening and configured to transmit said plurality of pressure sensor data values to the processing circuit.

17. The robotic system of claim 16, wherein the robot mechanism further comprises an actuator including a motor control mechanism disposed in the end effector, and wherein said processing circuit is further configured to transmit said tactile information to said motor control mechanism.

18. A method for controlling a robotic system including a control circuit and a robot mechanism having an end effector, the end effector being operably controlled by the control circuit to grasp a target object and to move the target object while being grasped by the end effector, the method comprising utilizing one or more tactile perception apparatus fixedly connected to the end effector to provide feedback information to the control circuit during said grasping and moving, wherein each said tactile perception apparatus comprises:

a base structure including a support plate configured for fixed connection to the end effector, said support plate having an upper surface and an opposing lower surface, the base structure being configured such that, during said operable interaction, said upper surface faces the target object and said lower surface faces away from the target object;

a pressure sensor array mounted onto the upper surface of the support plate and including a plurality of pressure sensors arranged such that each said pressure sensor is disposed over a corresponding upper surface region of the support plate, wherein each said pressure sensor of said pressure sensor array is configured to generate an associated pressure data value in response to an associated amount of contact force applied by said target object and directed toward said corresponding upper surface region of the support plate during said operable interaction; and a processing circuit attached to the support plate and configured to generate said tactile information in response to said pressure data values generated by said plurality of pressure sensors, said processing circuit being further configured to transmit said tactile information as a serial data signal to the control circuit, wherein controlling the end effector comprises transmitting control signals from the control circuit to a motor control mechanism disposed in the end effector, and wherein the method further comprises transmitting said tactile information to both said control circuit and to said motor control mechanism.

\* \* \* \* \*